US011778878B2

United States Patent
Yamazaki et al.

(10) Patent No.: US 11,778,878 B2
(45) Date of Patent: *Oct. 3, 2023

(54) DISPLAY PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Shunpei Yamazaki, Setagaya (JP); Koji Kusunoki, Isehara (JP); Kazunori Watanabe, Machida (JP); Susumu Kawashima, Atsugi (JP); Kei Takahashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/711,172

(22) Filed: Apr. 1, 2022

(65) Prior Publication Data
US 2022/0367595 A1 Nov. 17, 2022

Related U.S. Application Data

(63) Continuation of application No. 16/633,402, filed as application No. PCT/IB2018/055452 on Jul. 23, 2018, now Pat. No. 11,296,176.

(30) Foreign Application Priority Data

Jul. 27, 2017 (JP) .................................. 2017-145397

(51) Int. Cl.
*G09G 3/32* (2016.01)
*H10K 59/131* (2023.01)
(Continued)

(52) U.S. Cl.
CPC ............. *H10K 59/131* (2023.02); *G06N 3/04* (2013.01); *G06N 3/063* (2013.01); *G09G 3/32* (2013.01);
(Continued)

(58) Field of Classification Search
CPC .......................... G09G 5/14; G09G 2360/026; H01L 27/3293; G06F 3/1446; G06F 1/1647
See application file for complete search history.

(56) References Cited

U.S. PATENT DOCUMENTS 5,801,797 A 9/1998 Iida et al.
6,642,542 B1 11/2003 Shimoda et al.
(Continued)

FOREIGN PATENT DOCUMENTS

CN 101283307 A 10/2008
CN 104221071 A 12/2014
(Continued)

OTHER PUBLICATIONS

International Search Report (Application No. PCT/IB2018/055452) dated Sep. 25, 2018.
(Continued)

*Primary Examiner* — Kevin M Nguyen
(74) *Attorney, Agent, or Firm* — ROBINSON INTELLECTUAL PROPERTY LAW OFFICE; Eric J. Robinson

(57) ABSTRACT

A novel display panel that is highly convenient or reliable is provided. A novel display device is provided. The display panel includes a display region, a first terminal region, and a second terminal region, and the first terminal region is provided not to block the display region and includes a region overlapping with the display region. The first terminal region includes a first group of terminals, and the first group of terminals includes a first terminal. The second
(Continued)

terminal region includes a second group of terminals, and the second group of terminals includes a second terminal. The display region includes one group of pixels, another group of pixels, a scan line, and a signal line. The one group of pixels includes a pixel and is arranged in a row direction. The another group of pixels includes the pixel and is arranged in a column direction intersecting the row direction. The scan line is electrically connected to the one group of pixels. The signal line is electrically connected to the another group of pixels, and the signal line is electrically connected to the first terminal and the second terminal.

12 Claims, 17 Drawing Sheets

(51) Int. Cl.
　　*G06N 3/04* 　　(2023.01)
　　*G06N 3/063* 　　(2023.01)
　　*H01L 25/065* 　　(2023.01)
　　*H01L 27/15* 　　(2006.01)
　　*H10K 59/18* 　　(2023.01)

(52) U.S. Cl.
　　CPC ........ *H01L 25/0652* (2013.01); *H01L 27/156* (2013.01); *H10K 59/18* (2023.02); *G09G 2300/026* (2013.01)

(56) References Cited

U.S. PATENT DOCUMENTS

| | | |
|---|---|---|
| 7,399,991 B2 | 7/2008 | Seo et al. |
| 7,489,286 B2 | 2/2009 | Kawase et al. |
| 7,663,149 B2 | 2/2010 | Seo et al. |
| 7,679,284 B2 | 3/2010 | Kubota |
| 8,305,292 B2 | 11/2012 | Tamura et al. |
| 8,367,440 B2 | 2/2013 | Takayama et al. |
| 8,415,208 B2 | 4/2013 | Takayama et al. |
| 8,417,297 B2 | 4/2013 | Lee et al. |
| 8,796,701 B2 | 8/2014 | Nishiyama et al. |
| 8,816,938 B2 | 8/2014 | Tamura et al. |
| 10,141,069 B2 | 11/2018 | Ikeda et al. |
| 11,296,176 B2 * | 4/2022 | Yamazaki ............ G09F 9/30 |
| 2002/0011783 A1 | 1/2002 | Hosokawa |
| 2005/0285811 A1 | 12/2005 | Kawase et al. |
| 2006/0044215 A1 | 3/2006 | Brody et al. |
| 2007/0001927 A1 | 1/2007 | Ricks et al. |
| 2010/0177018 A1 | 7/2010 | Wang et al. |
| 2010/0201604 A1 | 8/2010 | Kee et al. |
| 2010/0298032 A1 | 11/2010 | Lee et al. |
| 2011/0050657 A1 | 3/2011 | Yamada |
| 2011/0057861 A1 | 3/2011 | Cok et al. |
| 2012/0119235 A1 | 5/2012 | Nishiyama et al. |
| 2012/0140160 A1 | 6/2012 | Han et al. |
| 2012/0268445 A1 | 10/2012 | Ogata et al. |
| 2013/0076597 A1 | 3/2013 | Becze |
| 2013/0200783 A1 | 8/2013 | Van Heck et al. |
| 2013/0201636 A1 | 8/2013 | Van Den Brand et al. |
| 2013/0201637 A1 | 8/2013 | De Kok et al. |
| 2013/0214324 A1 | 8/2013 | Takayama et al. |
| 2015/0028316 A1 | 1/2015 | Kojima et al. |
| 2015/0194123 A1 | 7/2015 | Lee et al. |
| 2015/0228704 A1 | 8/2015 | Miyake et al. |
| 2016/0014882 A1 | 1/2016 | Jongman et al. |
| 2016/0019019 A1 | 1/2016 | Ikeda et al. |
| 2016/0037608 A1 | 2/2016 | Ikeda et al. |
| 2016/0044751 A1 | 2/2016 | Ikeda et al. |
| 2016/0343452 A1 | 11/2016 | Ikeda et al. |
| 2019/0102136 A1 | 4/2019 | Yoshitani et al. |
| 2019/0164620 A1 | 5/2019 | Ikeda et al. |

FOREIGN PATENT DOCUMENTS

| | | |
|---|---|---|
| EP | 1899762 A | 3/2008 |
| JP | 01-312587 A | 12/1989 |
| JP | 10-063195 A | 3/1998 |
| JP | 2002-244592 A | 8/2002 |
| JP | 2005-202077 A | 7/2005 |
| JP | 2008-545164 | 12/2008 |
| JP | 2011-150259 A | 8/2011 |
| JP | 2011-215380 A | 10/2011 |
| JP | 2012-028638 A | 2/2012 |
| JP | 2014-075547 A | 4/2014 |
| JP | 2016-167045 A | 9/2016 |
| JP | 2016-219011 A | 12/2016 |
| KR | 2008-0078632 A | 8/2008 |
| TW | 201346856 | 11/2013 |
| WO | WO-2006/023901 | 3/2006 |
| WO | WO-2007/005245 | 1/2007 |
| WO | WO-2013/158248 | 10/2013 |

OTHER PUBLICATIONS

Written Opinion (Application No. PCT/IB2018/055452) dated Sep. 25, 2018.

* cited by examiner

DISPLAY PANEL, DISPLAY DEVICE, INPUT/OUTPUT DEVICE, AND DATA PROCESSING DEVICE

TECHNICAL FIELD

One embodiment of the present invention relates to a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A display device is known which includes two display panels, two plates, two stages, two driver circuits, two adjustment means, and a frame and in which the display panel includes a display portion, an operation circuit portion, a terminal, an external electrode, a transparent portion, and a first portion and is flexible; the transparent portion includes a region transmitting visible light; the display panel is fixed on the plate such that part of the transparent portion and part of the display portion protrude from the plate; and the display portion of one of the two display panels and the transparent portion of the other of the two display panels overlap with each other (Patent Document 1).

REFERENCE

Patent Document

[Patent Document 1] Japanese Published Patent Application No. 2016-167045

SUMMARY OF THE INVENTION

Problems to be Solved by the Invention

An object of one embodiment of the present invention is to provide a novel display panel that is highly convenient or reliable. Alternatively, an object is to provide a novel display device that is highly convenient or reliable. Alternatively, an object is to provide a novel input/output device that is highly convenient or reliable. Alternatively, an object is to provide a novel data processing device that is highly convenient or reliable. Alternatively, an object is to provide a novel display panel, a novel display device, a novel input/output device, a novel data processing device, or a novel semiconductor device.

Note that the descriptions of these objects do not disturb the existence of other objects. One embodiment of the present invention does not need to achieve all of these objects. Other objects will be apparent from and can be derived from the description of the specification, the drawings, the claims, and the like.

Means for Solving the Problems (1) One embodiment of the present invention is a display panel including a display region, a first terminal region, and a second terminal region.

The first terminal region is provided not to block the display region, and the first terminal region includes a region overlapping with the display region. The first terminal region includes a first group of terminals, and the first group of terminals includes a first terminal.

The second terminal region includes a second group of terminals, and the second group of terminals includes a second terminal.

The display region includes one group of pixels, another group of pixels, a scan line, and a signal line.

The one group of pixels includes a pixel, and the one group of pixels is arranged in a row direction.

The another group of pixels includes the pixel, and the another group of pixels is arranged in a column direction intersecting the row direction.

The scan line is electrically connected to the one group of pixels.

The signal line is electrically connected to the another group of pixels, and the signal line is electrically connected to the first terminal and the second terminal.

In this manner, for example, one of the first terminal and the second terminal can supply a signal supplied from the other of the first terminal and the second terminal. Alternatively, the signal supplied from the one of the first terminal and the second terminal can be distributed to the other of the first terminal and the second terminal and the another group of pixels, for example.

Alternatively, the first terminal can be provided without reducing display quality. Alternatively, the first terminal can be hidden from a user. Alternatively, the light-transmitting property of the outside of the display region is not reduced. Alternatively, the display region can be made close to another object. Alternatively, the display region can be aligned with another object. Alternatively, the display region can be adjacent to a display region of another display panel. As a result, a novel display panel that is highly convenient or reliable can be provided.

(2) One embodiment of the present invention is the above-described display panel in which the signal line includes a first region to a third region.

The third region includes a region sandwiched between the first region and the second region.

The signal line is electrically connected to the first terminal in the first region, the signal line is electrically connected to the second terminal in the second region, and the signal line is electrically connected to the pixel in the third region.

In this manner, for example, the first terminal can be electrically connected to one end portion of the signal line, the second terminal can be electrically connected to the other end portion, and the pixel can be electrically connected between the one end portion and the other end portion of the signal line.

Alternatively, a signal other than the signal which is supplied from the one of the first terminal and the second terminal and which is to be displayed by the another group of pixels can be supplied from the other of the first terminal and the second terminal.

Alternatively, the signal which is not to be displayed on the display panel can be transmitted through a signal line. As a result, a novel display panel that is highly convenient or reliable can be provided.

(3) One embodiment of the present invention is the above-described display panel including a first driver circuit and a second driver circuit.

The first driver circuit is electrically connected to the scan line, and the first driver circuit has a function of supplying a selection signal.

The second driver circuit is electrically connected to the second terminal, and the second driver circuit has a function of supplying an image signal.

In this manner, for example, an image signal to be displayed on the display panel and an image signal to be displayed on the another display panel can be supplied to the second terminal. Alternatively, for example, an image signal which is supplied to the second terminal and which is to be displayed on the another display panel can be supplied from the first terminal. As a result, a novel display panel that is highly convenient or reliable can be provided.

(4) One embodiment of the present invention is a display device including one group of display panels and another group of display panels.

The one group of display panels is arranged in a row direction, and the one group of display panels includes the above-described display panel.

The another group of display panels is arranged in a column direction intersecting the row direction, and the another group of display panels includes the display panel and another display panel.

The another display panel includes a third terminal region and another display region.

The third terminal region is provided outside the another display region, the third terminal region includes a region overlapping with the first terminal region, and the third terminal region includes a third group of terminals.

The third group of terminals includes a third terminal, and the third terminal is electrically connected to the first terminal.

The another display region is provided to enable display to be seen from a direction in which display of the display region can be seen.

In this manner, display panels of the one group can be provided close to each other. Alternatively, display regions of the display panels of the one group can be provided continuously. Alternatively, display panels of the another group can be provided close to each other. Alternatively, display regions of the display panels of the another group can be provided continuously.

Alternatively, a continuous image can be displayed on the one group of display panels. Alternatively, a continuous image can be displayed on the another group of display panels.

Alternatively, an image signal which is supplied to the second terminal of the display panel and which is to be displayed on another display panel can be supplied from the first terminal of the display panel to the third terminal of the another display panel. Consequently, a novel display device that is highly convenient or reliable can be provided.

(5) One embodiment of the present invention is the display device in which the another display panel includes a fourth terminal region.

The fourth terminal region is provided not to block the another display region, and the fourth terminal region includes a region overlapping with the another display region. The fourth terminal region includes a fourth group of terminals.

The fourth group of terminals includes a fourth terminal.

The another display region includes another pixel and another signal line, and the another signal line is electrically connected to the another pixel, the third terminal, and the fourth terminal.

In this manner, the fourth terminal can supply a signal supplied from the third terminal, for example. Alternatively, the signal supplied from the third terminal can be distributed to the fourth terminal and another pixel, for example.

Alternatively, the fourth terminal can be provided without reducing display quality. Alternatively, the fourth terminal can be hidden from a user. Alternatively, the light-transmitting property of the outside of the another display region is not reduced. Alternatively, the another display region can be made close to another object. Alternatively, the another display region can be aligned with another object. As a result, a novel display device that is highly convenient or reliable can be provided.

(6) One embodiment of the present invention is the above-described display device including a control portion.

The control portion is supplied with image data and control data, the control portion generates data on the basis of the image data, and the control portion generates a first control signal on the basis of the control data. The control portion supplies the data and the first control signal.

The first driver circuit generates the selection signal and a second control signal on the basis of the first control signal, and the first driver circuit supplies the selection signal and the second control signal.

The second driver circuit supplies an image signal on the basis of the data.

The first terminal region includes a fifth terminal, the fifth terminal is electrically connected to the first driver circuit, and the fifth terminal is supplied with the second control signal.

The second terminal region includes a sixth terminal, and the sixth terminal is electrically connected to the fifth terminal.

The another display panel includes a third driver circuit and another scan line.

The third driver circuit is electrically connected to the sixth terminal and the another scan line, and the third driver circuit generates and supplies another selection signal on the basis of the second control signal.

The another pixel is electrically connected to the another scan line and the another signal line, and the another pixel is supplied with the data and the another selection signal.

Thus, operations of the first driver circuit to the third driver circuit can be synchronized with each other. Alternatively, the one group of display panels can display a continuous image in synchronization with each other. Alternatively, the another group of display panels can display a continuous image in synchronization with each other. Consequently, a novel display device that is highly convenient or reliable can be provided.

(7) One embodiment of the present invention is an input/output device including an input portion and a display portion.

The display portion includes the above-described display panel, and the input portion includes a sensing region.

The input portion senses an object approaching the sensing region, and the sensing region includes a region overlapping with the pixel.

Thus, the object approaching the region overlapping with the display portion can be sensed while image data is displayed by using the display portion. Alternatively, a finger or the like that approaches the display portion can be used as a pointer to input positional data. Alternatively, positional data can be associated with image data displayed on the display portion. Consequently, a novel input/output device that is highly convenient or reliable can be provided.

(8) One embodiment of the present invention is a data processing device including an arithmetic device and an input/output device.

The arithmetic device is supplied with input data or sensing data, and the arithmetic device supplies control data and image data.

The input/output device supplies the input data and the sensing data, and the input/output device is supplied with the control data and the image data. The input/output device includes a display portion, an input portion, and a sensing portion.

The display portion includes the above-described display panel, and the display portion displays the image data on the basis of the control data.

The input portion generates the input data, and the sensing portion generates the sensing data.

(9) One embodiment of the present invention is the data processing device in which the above-described arithmetic device includes an artificial intelligence portion.

The artificial intelligence portion is supplied with the input data or the sensing data, the artificial intelligence portion supplies the control data, and the artificial intelligence portion includes a semiconductor device.

The semiconductor device infers the control data on the basis of the input data or the sensing data.

In this manner, the control data for display that can be felt suitable can be generated. Alternatively, display that can be felt suitable is possible. Alternatively, the control data for display that can be felt comfortable can be generated. Alternatively, display that can be felt comfortable is possible. Consequently, a novel data processing device that is highly convenient or reliable can be provided.

(10) One embodiment of the present invention is the data processing device in which the above-described semiconductor device includes a neural network.

The neural network includes an input layer, an intermediate layer, and an output layer, the input layer includes a first group of neuron circuits, the intermediate layer includes a second group of neuron circuits, and the output layer includes a third group of neuron circuits.

The second group of neuron circuits includes a first neuron circuit and a second neuron circuit.

The first neuron circuit is electrically connected to the first group of neuron circuits, and the second neuron circuit is electrically connected to the third group of neuron circuits.

The first group of neuron circuits is supplied with the input data or the sensing data, and the third group of neuron circuits supplies the control data.

(11) One embodiment of the present invention is the data processing device in which the above-described first neuron circuit is supplied with one group of input signals, one group of weight data, and a bias signal.

The first neuron circuit includes a product-sum operation unit and a converter.

The product-sum operation unit is electrically connected to the converter, and the product-sum operation unit generates a product-sum signal on the basis of a product-sum value of the one group of input signals and the one group of weight data and the bias signal.

The converter generates an output signal on the basis of the product-sum signal.

(12) One embodiment of the present invention is a data processing device including one or more of a keyboard, a hardware button, a pointing device, a touch sensor, an illuminance sensor, an imaging device, an audio input device, a sight input device, and an attitude detection device, and the above-described display panel.

Thus, an arithmetic device can generate image data or control data on the basis of data supplied using a variety of input devices. As a result, a novel data processing device that is highly convenient or reliable can be provided.

Although in the drawings attached to this specification, the block diagram in which components are classified by their functions and shown as independent blocks is illustrated, it is difficult to divide actual components according to their functions completely and it is possible for one component to relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other depending on the above relation of the potentials.

In this specification, a source of a transistor means a source region that is part of a semiconductor film functioning as an active layer or a source electrode connected to the above semiconductor film. Similarly, a drain of a transistor means a drain region that is part of the above semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which current, voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor so that current, voltage, or a potential can be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel display panel, a novel display device, a novel input/output device, a novel data processing device, or a novel semiconductor device can be provided.

Note that the descriptions of the effects do not disturb the existence of other effects. One embodiment of the present invention does not necessarily achieve all the effects. Other effects will be apparent from and can be derived from the description of the specification, the drawings, the claims, and the like.

MODE FOR CARRYING OUT THE INVENTION

Figure 1A:
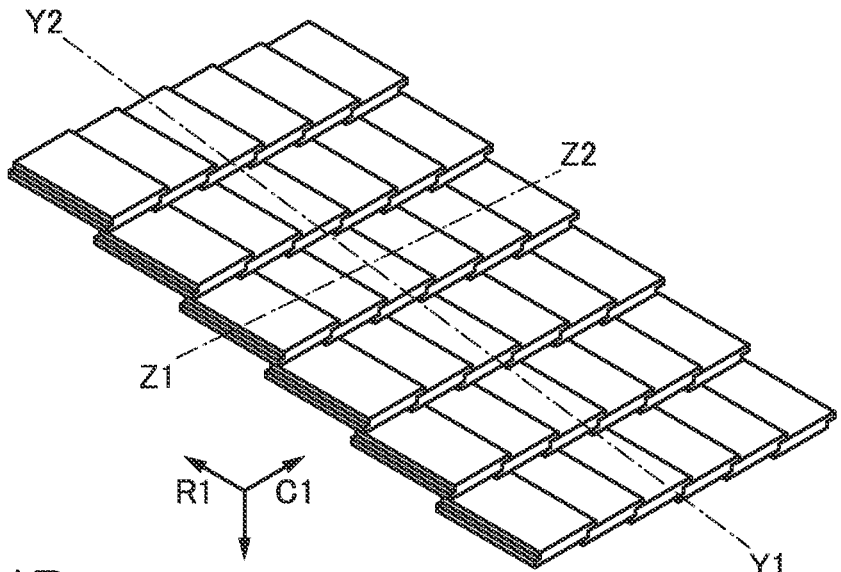
FIGS. 1A-1D Diagrams illustrating a structure of a display device including a display panel of Embodiment.

The display panel of one embodiment of the present invention includes a display region, a first terminal region, and a second terminal region.

The first terminal region is provided not to block the display region and includes a region overlapping with the display region.

The first terminal region includes a first group of terminals, and the first group of terminals includes a first terminal.

The second terminal region includes a second group of terminals, and the second group of terminals includes a second terminal.

The display region includes one group of pixels, another group of pixels, a scan line, and a signal line.

The one group of pixels includes a pixel and is arranged in a row direction. The another group of pixels includes the pixel and is arranged in a column direction intersecting the row direction.

The scan line is electrically connected to the one group of pixels. The signal line is electrically connected to the another group of pixels, and the signal line is electrically connected to the first terminal and the second terminal.

In this manner, for example, one of the first terminal and the second terminal can supply a signal supplied from the other of the first terminal and the second terminal. Alternatively, the signal supplied from the one of the first terminal and the second terminal can be distributed to the other of the first terminal and the second terminal and the another group of pixels, for example.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the present invention described below, the same portions or portions having similar functions are denoted by the same reference numerals in different drawings, and a description thereof is not repeated.

Embodiment 1

In this embodiment, a structure of a display panel of one embodiment of the present invention will be described with reference to FIG. 1 to FIG. 10.

FIG. 1 is a diagram illustrating a structure of the display device including the display panel of one embodiment of the present invention. FIG. 1(A) is a perspective view of the display device of one embodiment of the present invention and FIG. 1(B) is a top view. FIG. 1(C) is a cross-sectional view taken along a cutting line Y1-Y2 in FIG. 1(B), and FIG. 1(D) is a cross-sectional view taken along a cutting line Z1-Z2 in FIG. 1(B).

FIG. 2 is a diagram illustrating the structure of the display panel of one embodiment of the present invention. FIG. 2(A) is a perspective view of the display panel of one embodiment of the present invention and FIG. 2(B) is a top view. FIG. 2(C) is a cross-sectional view taken along a cutting line Y1-Y2 in FIG. 2(B), and FIG. 2(D) is a cross-sectional view taken along a cutting line Z1-Z2 in FIG. 2(B).

Figure 3A:
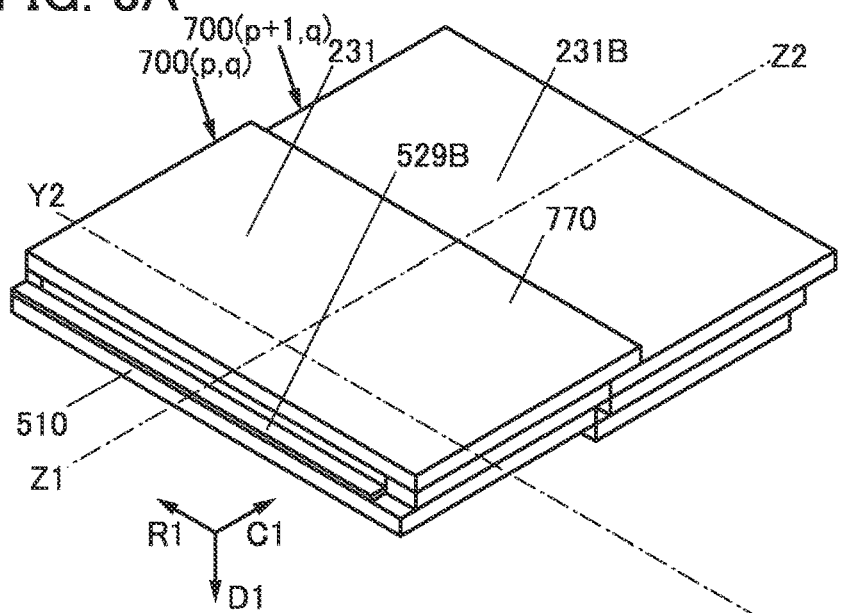
FIGS. 3A-3C Diagrams illustrating a structure of a display panel of Embodiment.
Figure 3B:
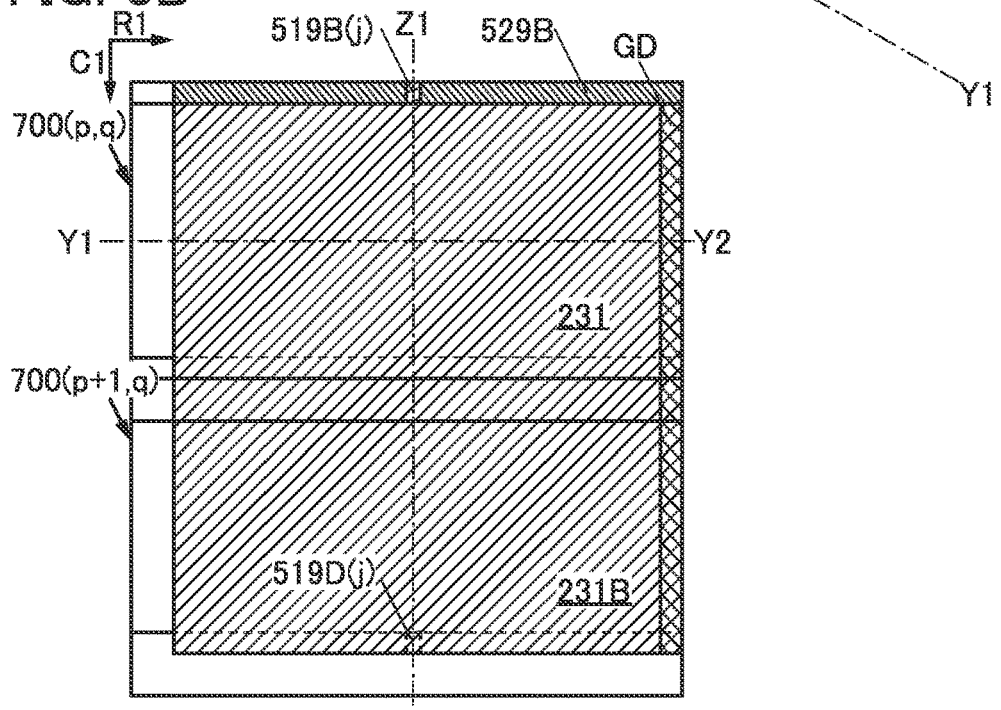
Figure 3C:
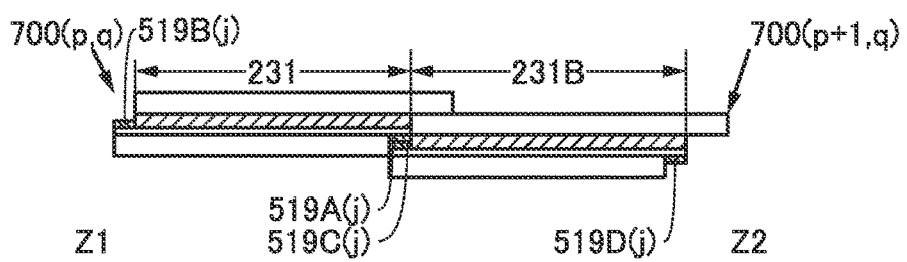

FIG. 3 is a diagram illustrating the structure of the display panel of one embodiment of the present invention. FIG. 3(A) is a perspective view of the display panel of one embodiment of the present invention and FIG. 3(B) is a top view. FIG. 3(C) is a cross-sectional view taken along a cutting line Z1-Z2 in FIG. 3(B).

Figure 4A:
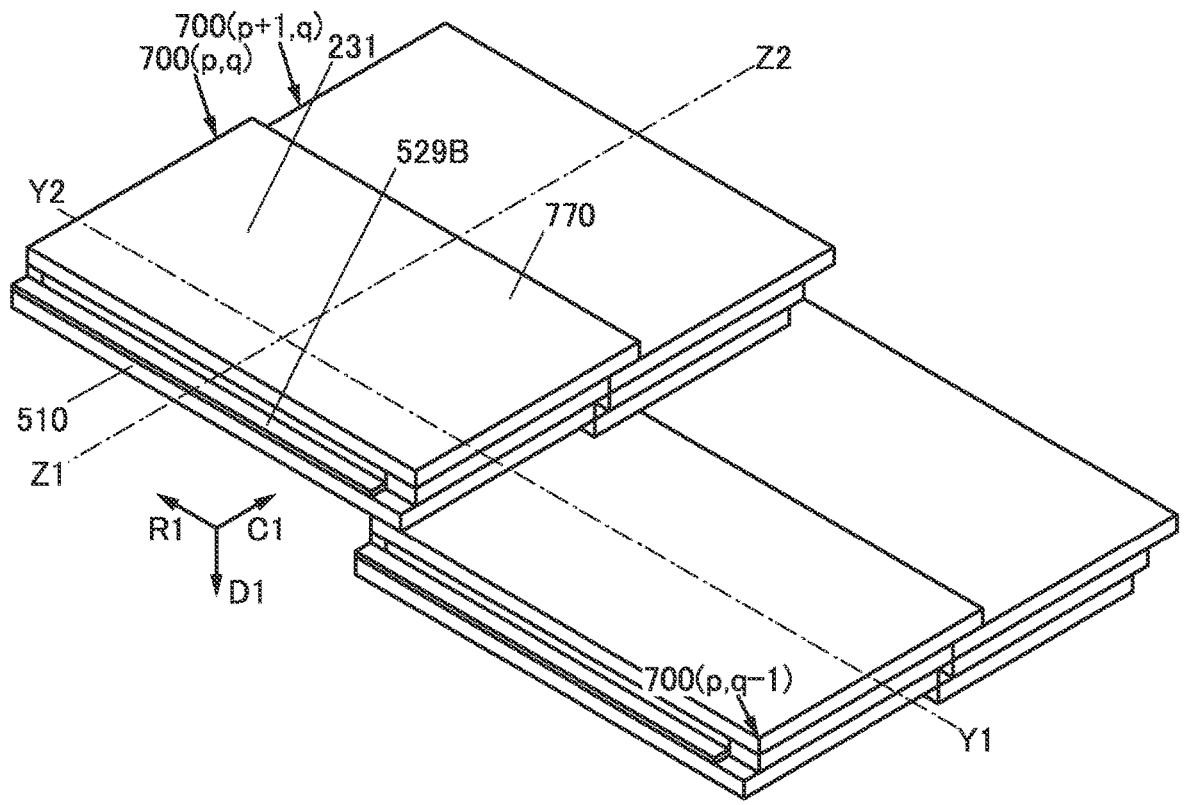
FIGS. 4A-4C Diagrams illustrating a structure of a display panel of Embodiment.
Figure 4B:
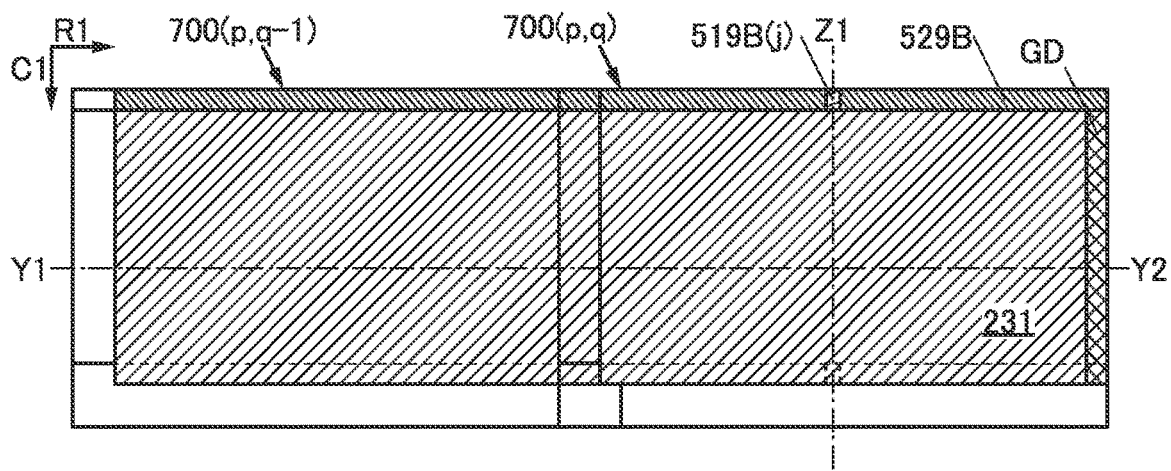
Figure 4C:
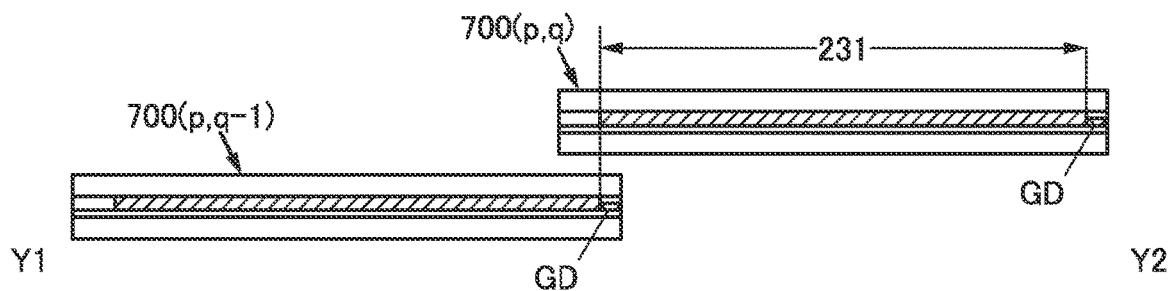

FIG. 4 is a diagram illustrating the structure of the display panel of one embodiment of the present invention. FIG. 4(A) is a perspective view of the display panel of one embodiment of the present invention and FIG. 4(B) is a top view. FIG. 4(C) is a cross-sectional view taken along a cutting line Y1-Y2 in FIG. 4(B).

Figure 5:
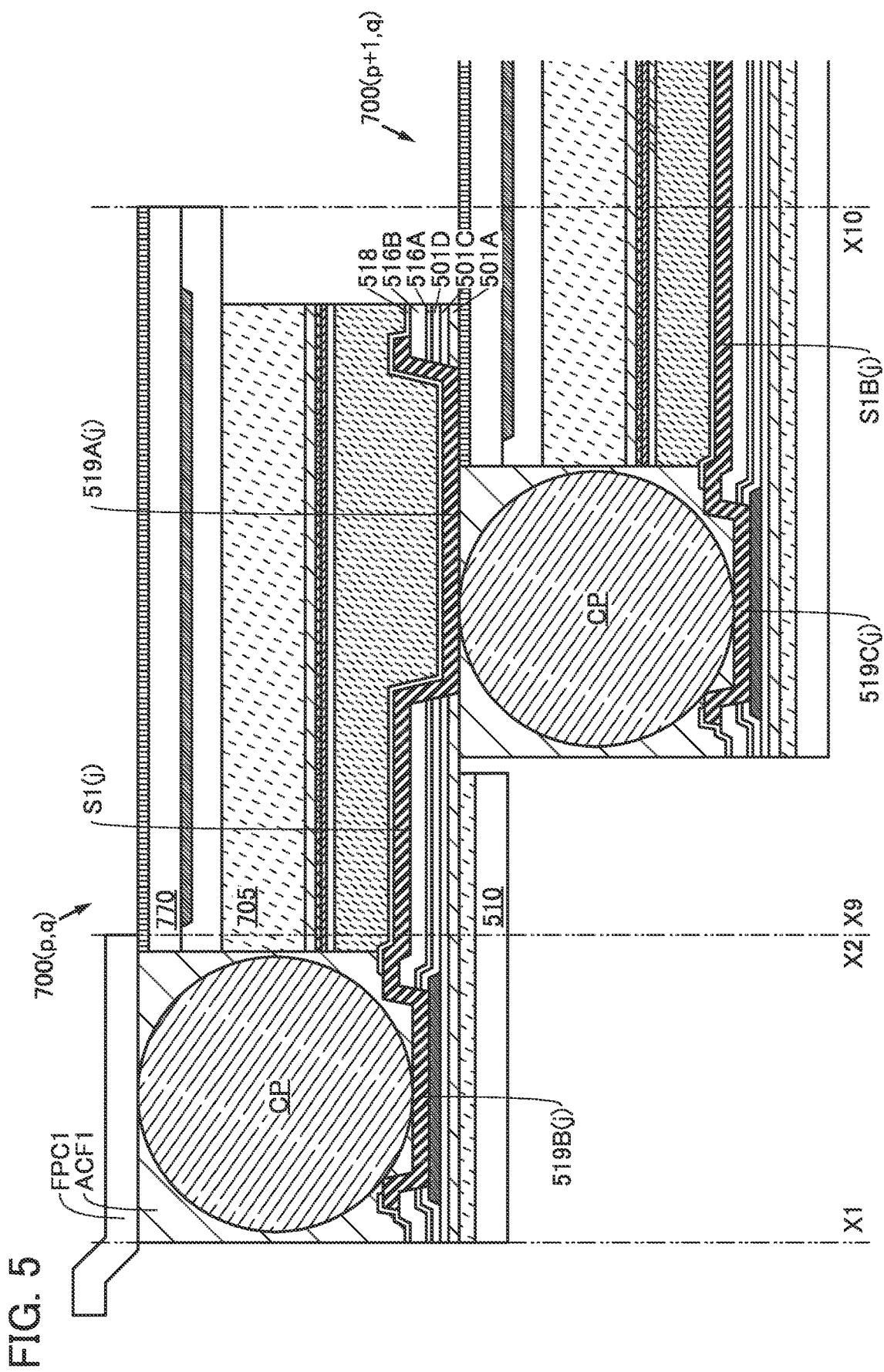
FIG. 5 A diagram illustrating a structure of a display panel of Embodiment.

FIG. 5 is a diagram illustrating the structure of the display panel of one embodiment of the present invention. FIG. 5 is a cross-sectional view taken along a cutting line X9-X10 in FIG. 6(A).

Figure 6A:
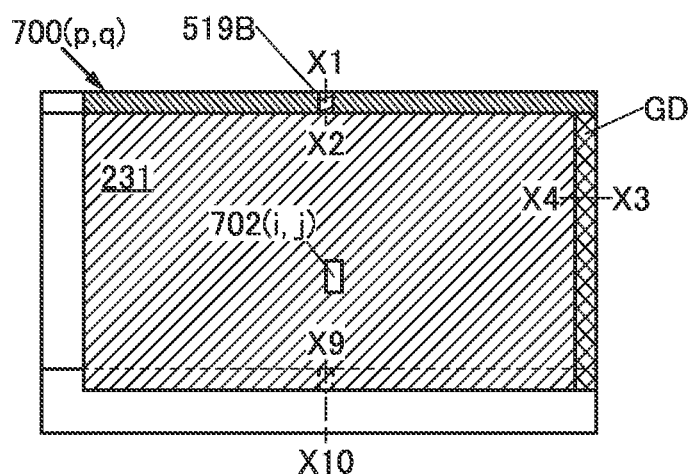
FIGS. 6A-6C Diagrams illustrating a structure of a display panel of Embodiment.
Figure 6B:
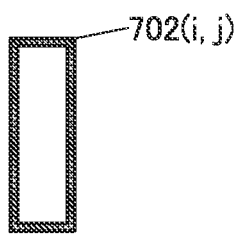
Figure 6C:
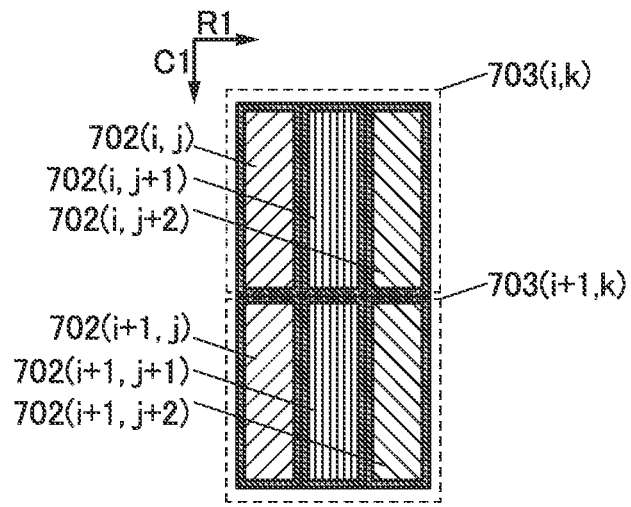

FIG. 6 is a diagram illustrating the structure of the display panel of one embodiment of the present invention. FIG. 6(A) is a top view of the display panel and FIG. 6(B) and FIG. 6(C) are top views illustrating part of a pixel of the display panel illustrated in FIG. 6(A).

Figure 7A:
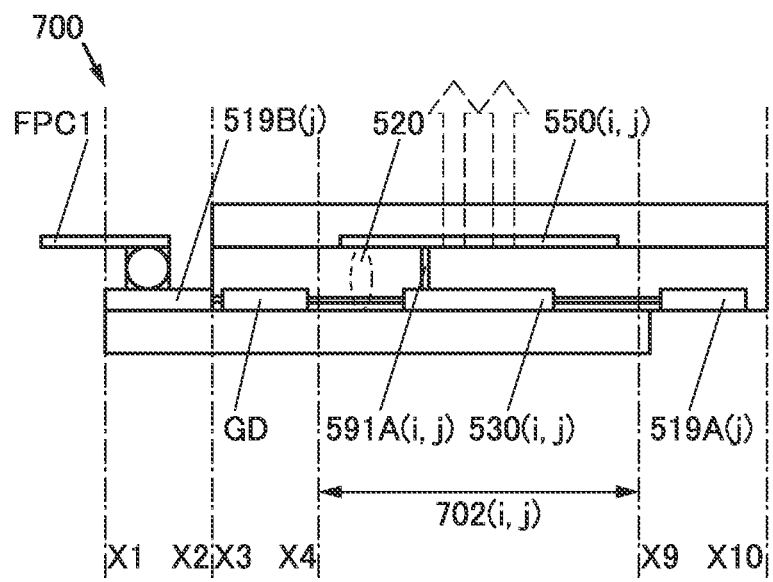
FIGS. 7A-7B Diagrams illustrating a structure of a display panel of Embodiment.
Figure 7B:
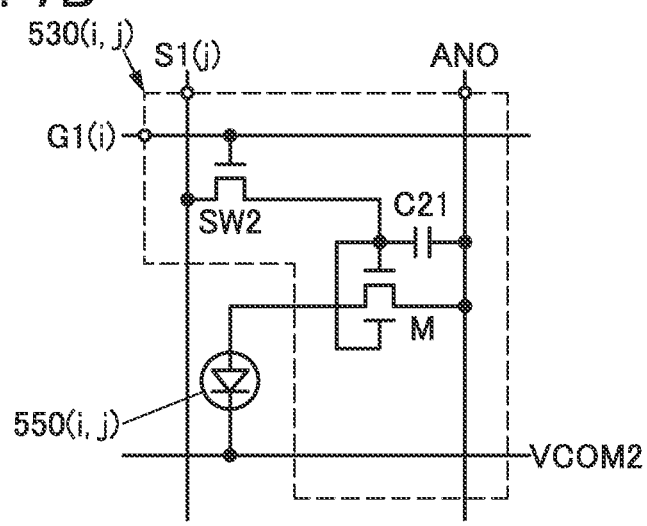

FIG. 7(A) is a cross-sectional view taken along a cutting line X1-X2, a cutting line X3-X4, and the cutting line X9-X10 in FIG. 6(A). FIG. 7(B) is a circuit diagram illustrating a structure of a pixel circuit included in the display panel.

Figure 8A:
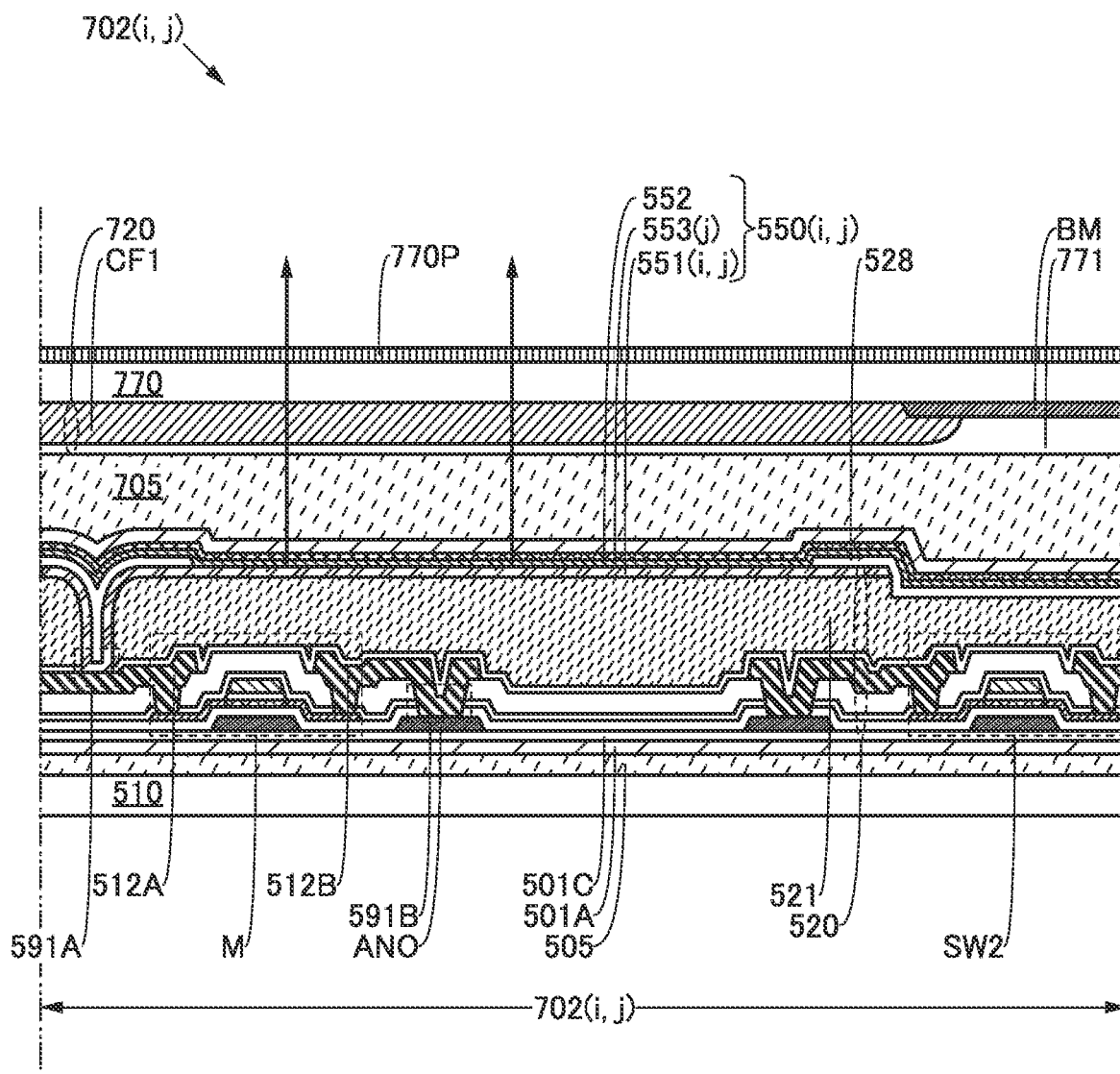
FIGS. 8A-8B Diagrams illustrating a structure of a display panel of Embodiment.
Figure 8B:
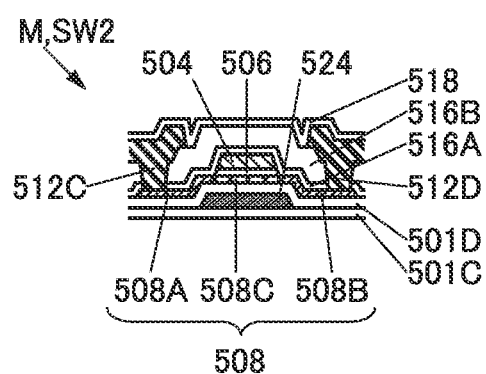

FIG. 8(A) is a diagram illustrating a structure of the pixel of the display panel of one embodiment of the present invention. FIG. 8(B) is a cross-sectional view illustrating part of the pixel illustrated in FIG. 8(A).

Figure 9:
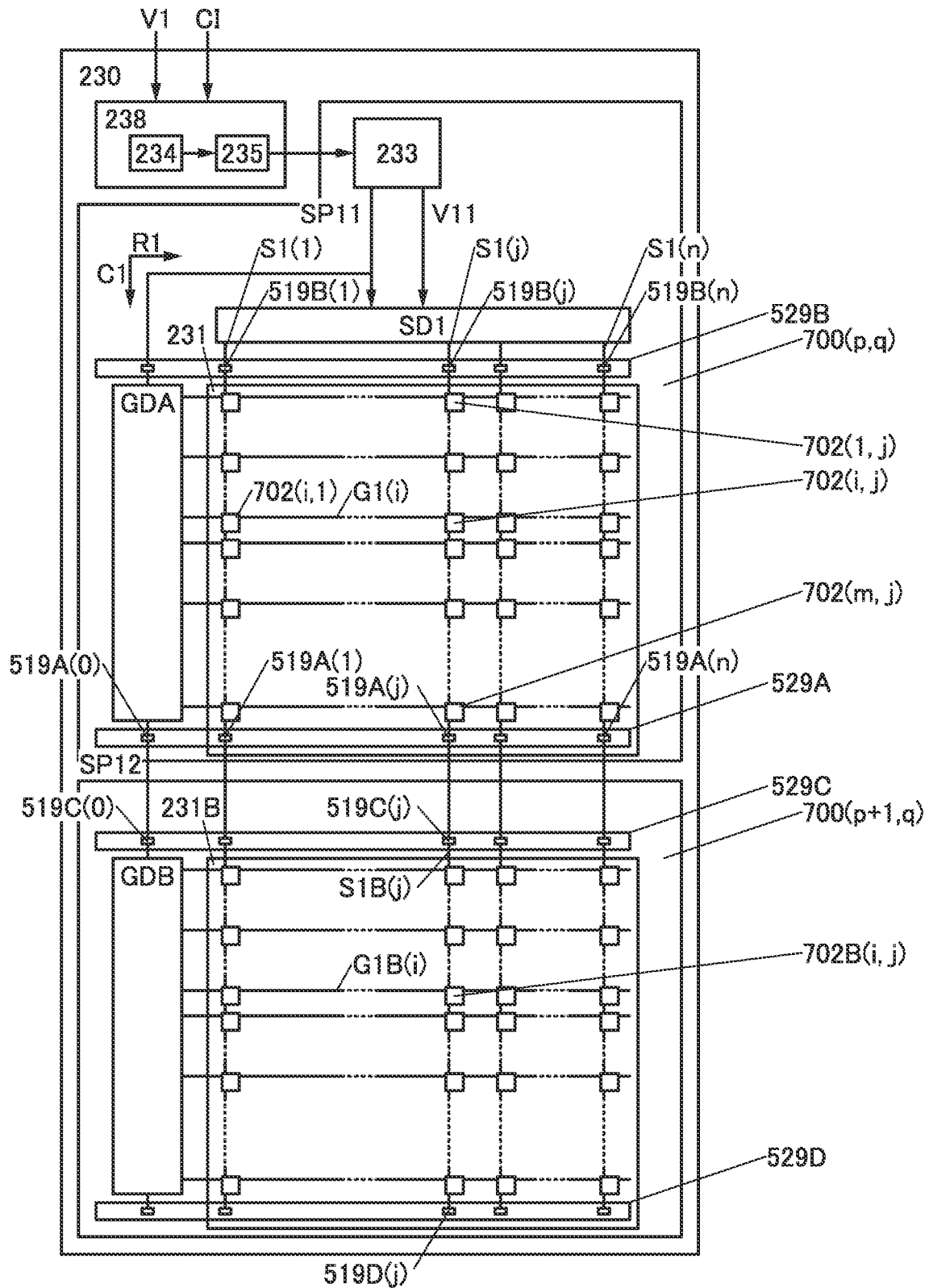
FIG. 9 A diagram illustrating a structure of a display device of Embodiment.

FIG. 9 is a block diagram illustrating the structure of the display device of one embodiment of the present invention.

Note that in this specification, an integer variable of 1 or more is sometimes used for reference numerals. For example, (p) where p is an integer variable of 1 or more is sometimes used for part of a reference numeral that specifies any one of components (p components at a maximum). For another example, (m,n) where m and n are each an integer variable of 1 or more is sometimes used for part of a reference numeral that specifies any one of components (m×n components at a maximum).

Figure 10A:
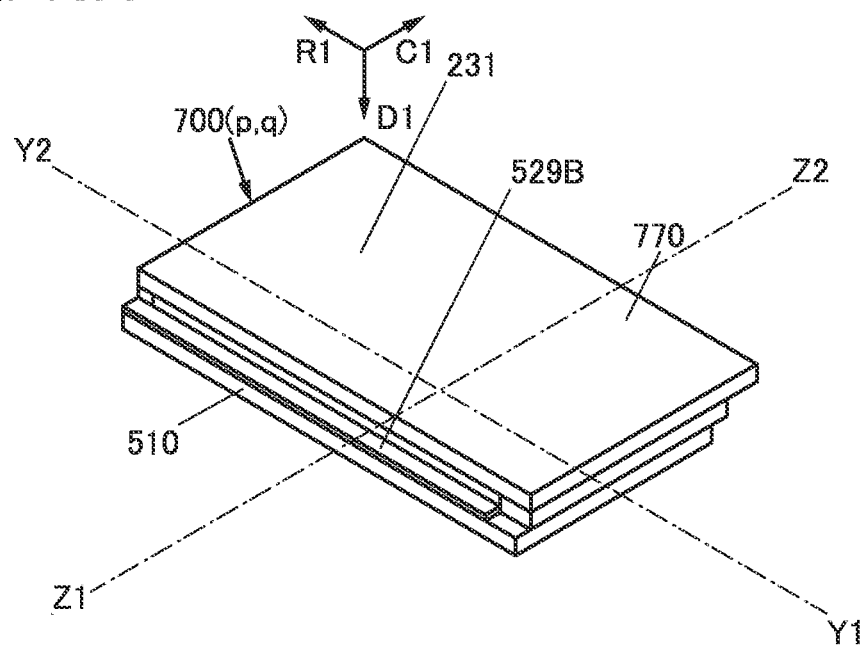
FIGS. 10A-10B Perspective views illustrating a structure of a display panel of Embodiment.
Figure 10B:
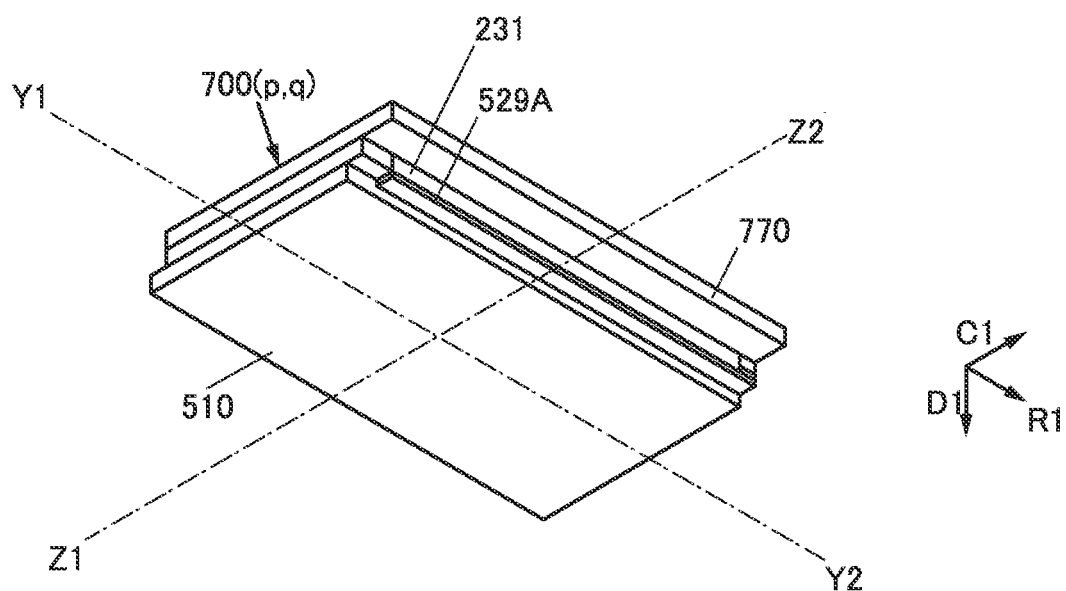

FIG. 10 is a diagram illustrating the structure of the display panel of one embodiment of the present invention. FIG. 10(A) is a perspective view of the display panel of one embodiment of the present invention seen obliquely from above and FIG. 10(B) is a perspective view of the display panel seen obliquely from below.

Figure 1B:
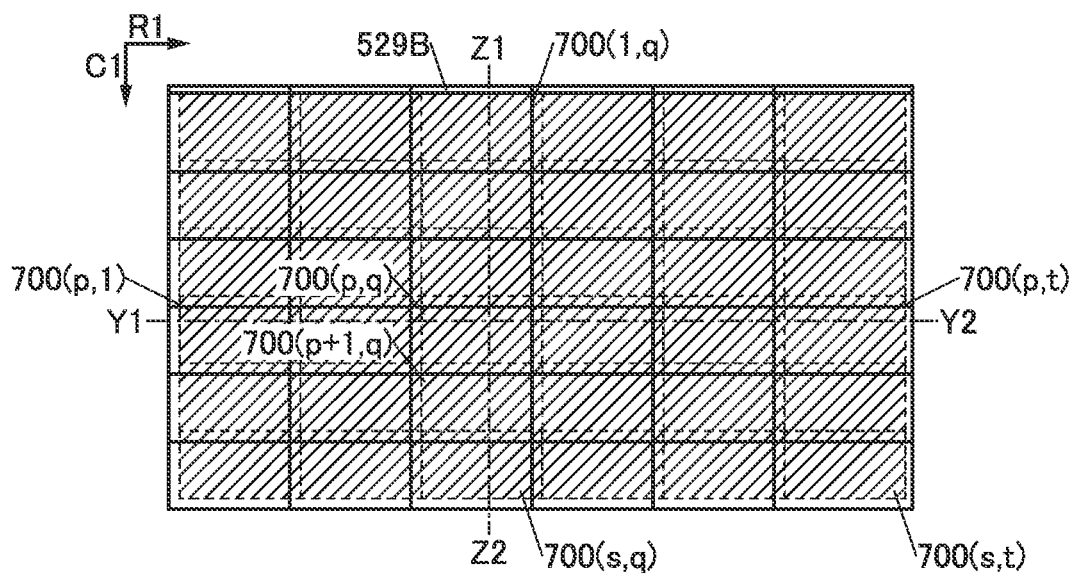
Figure 1C:
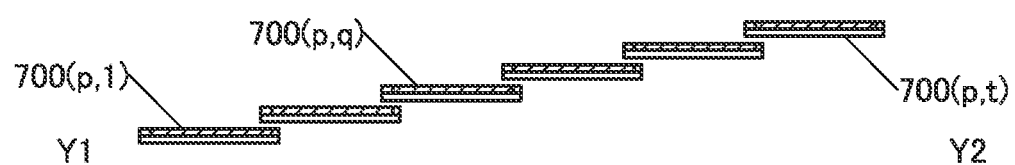
Figure 1D:
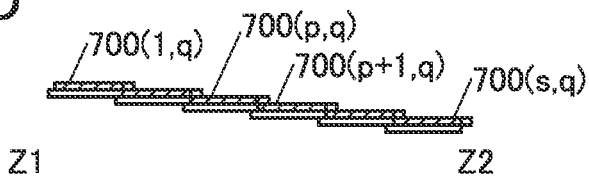
Figure 2A:
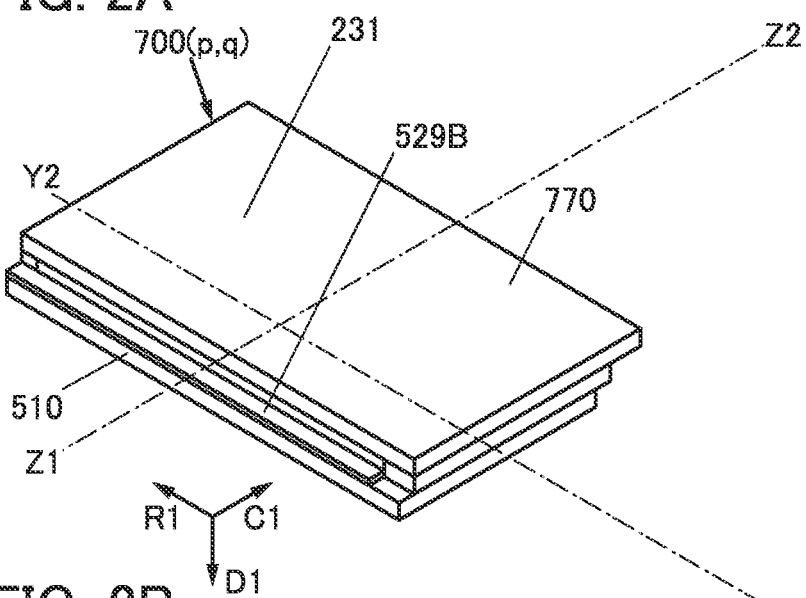
FIGS. 2A-2D Diagrams illustrating a structure of a display panel of Embodiment.
Figure 2B:
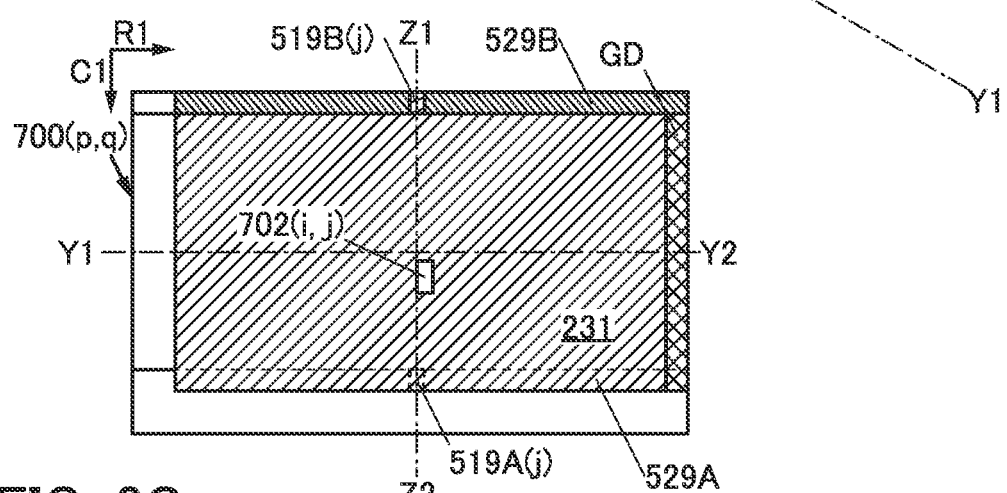
Figure 2C:
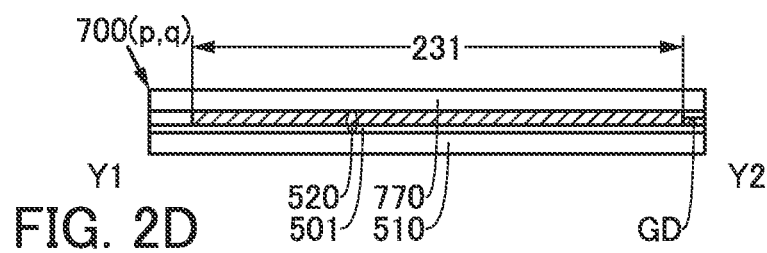
Figure 2D:
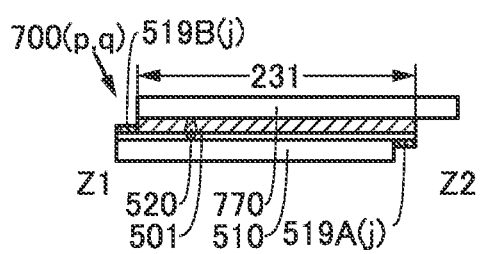

The display panel $700(p,q)$ described in this embodiment can be used for one display device in such a manner that a plurality of display panels $700(p,q)$ are arranged, for example (see FIG. 1(A) and FIG. 1(B)).

Structure Example 1 of Display Panel $700(p,q)$

The display panel $700(p,q)$ described in this embodiment includes a display region 231, a terminal region 529A, and a terminal region 529B (see FIG. 10(A) and FIG. 10(B)).
<<Terminal Region 529A>>

The terminal region 529A is provided so as not to block the display region 231 and the terminal region 529A includes a region overlapping with the display region 231. Specifically, the terminal region 529A is provided on the depth direction (the direction indicated by an arrow D1 in the diagram) side of the display region 231 (see FIG. 10(B)). The display region 231 performs display in a direction opposite to the depth direction. In other words, the terminal region 529A is provided on the rear surface of the display region 231. Accordingly, the terminal region 529A can be provided so as to overlap with the display region 231 without blocking display of the display region 231.

The terminal region 529A includes one group of a terminal $519A(1)$ to a terminal $519A(n)$, and the one group of the terminal $519A(1)$ to the terminal $519A(n)$ includes a terminal $519A(j)$ (see FIG. 9).
<<Terminal Region 529B>>

The terminal region 529B includes one group of a terminal $519B(1)$ to a terminal $519B(n)$, and the one group of the terminal $519B(1)$ to the terminal $519B(n)$ includes a terminal $519B(j)$. The terminal region 529B is provided outside the display region 231 (see FIG. 10(A)).
<<Display Region 231>>

The display region 231 includes one group of a pixel $702(i,1)$ to a pixel $702(i,n)$, another group of a pixel $702(1,j)$ to a pixel $702(m,j)$, a scan line $G1(i)$, and a signal line $S1(j)$ (see FIG. 9).

The one group of the pixel $702(i,1)$ to the pixel $702(i,n)$ includes a pixel $702(i,j)$ and is arranged in a row direction (the direction indicated by an arrow R1 in the diagram).

The another group of the pixel $702(1,j)$ to the pixel $702(m,j)$ includes the pixel $702(i,j)$ and is arranged in the column direction (the direction indicated by an arrow C1 in the diagram) that intersects the row direction.
<<Scan Line $G1(i)$>>

The scan line $G1(i)$ is electrically connected to the one group of the pixel $702(i,1)$ to the pixel $702(i,n)$.
<<Signal Line $S1(j)$>>

The signal line $S1(j)$ is electrically connected to the another group of the pixel $702(1,j)$ to the pixel $702(m,j)$ and is electrically connected to the terminal $519A(j)$ and the terminal $519B(j)$.

In this manner, for example, one of the first terminal $519A(j)$ and the second terminal $519B(j)$ can supply a signal supplied from the other of the first terminal $519A(j)$ and the second terminal $519B(j)$. Alternatively, the signal supplied from the one of the first terminal $519A(j)$ and the second terminal $519B(j)$ can be distributed to the other of the first terminal $519A(j)$ and the second terminal $519B(j)$ and the another group of the pixel $702(1,j)$ to the pixel $702(m,j)$, for example.

Alternatively, the first terminal $519A(j)$ can be provided without reducing display quality. Alternatively, the first terminal $519A(j)$ can be hidden from a user. Alternatively, the light-transmitting property of the outside of the display region 231 is not reduced. Alternatively, the display region 231 can be made close to another object. Alternatively, the display region 231 can be aligned with another object. Alternatively, the display region 231 can be adjacent to a display region of another display panel. As a result, a novel display panel that is highly convenient or reliable can be provided.
<<Signal Line $S1(j)$>>

The signal line $S1(j)$ includes a first region, a second region, and a third region. The third region is sandwiched between the first region and the second region.

The signal line $S1(j)$ is electrically connected to the terminal $519A(j)$ in the first region and is electrically connected to the terminal $519B(j)$ in the second region (see FIG. 9). Furthermore, the signal line $S1(j)$ is electrically connected to the pixel $702(i,j)$ in the third region.

In this manner, for example, the first terminal $519A(j)$ can be electrically connected to one end portion of the signal line $S1(j)$, the second terminal $519B(j)$ can be electrically connected to the other end portion, and the pixel $702(i,j)$ can be electrically connected between the one end portion and the other end portion of the signal line $S1(j)$.

Alternatively, a signal other than the signal which is supplied from the one of the first terminal $519A(j)$ and the second terminal $519B(j)$ and which is to be displayed by the another group of the pixel $702(1,j)$ to the pixel $702(m,j)$ can be supplied from the other of the first terminal $519A(j)$ and the second terminal $519B(j)$. Alternatively, the signal which is not to be displayed on the display panel can be transmitted through a signal line. As a result, a novel display panel that is highly convenient or reliable can be provided.

Structure Example 2 of Display Panel 700(*p*,*q*)

The display panel of one embodiment of the present invention further includes a driver circuit GDA and a driver circuit SD1 (see FIG. 9).

<<Structure Example 1 of Driver Circuit GDA>>

The driver circuit GDA is electrically connected to the scan line G1(*i*) and the driver circuit GDA has a function of supplying a selection signal.

The driver circuit GDA includes a shift register and a latch circuit. For example, a transistor having the same structure as the transistor used for a pixel circuit 530(*i*,*j*) can be used for the driver circuit GDA (see FIG. 8(A) and FIG. 8(B)). Thus, the driver circuit GDA and the pixel circuit 530(*i*,*j*) can be fabricated through the same process.

The size and the like of the transistor used for the driver circuit GDA can be designed such that the transistor operates at a higher speed than the transistor used for the pixel circuit 530(*i*,*j*).

<<Structure Example 2 of Driver Circuit GDA>>

The driver circuit GDA has a function of supplying a selection signal to the scan line G1(*i*) at a frequency of higher than or equal to 30 Hz. Alternatively, the driver circuit GDA has a function of supplying a selection signal at various frequencies. For example, the driver circuit GDA has a function of supplying a selection signal to the scan line G1(*i*) at a frequency of lower than or equal to 1 Hz or higher than or equal to 30 Hz.

<<Structure Example 1 of Driver Circuit SD1>>

The driver circuit SD1 is electrically connected to the second terminal 519B(j), and the driver circuit SD1 has a function of supplying an image signal.

In this manner, for example, an image signal to be displayed on one display panel and an image signal to be displayed on another display panel can be supplied to the second terminal 519B(j). Alternatively, for example, an image signal which is supplied to the second terminal 519B(j) and which is to be displayed on the another display panel can be supplied from the first terminal 519A(j). As a result, a novel display panel that is highly convenient or reliable can be provided.

The driver circuit SD1 includes a shift register, a latch circuit, a digital-analog converter circuit, a buffer amplifier, and the like. The digital-analog converter circuit includes, for example, a logic circuit using a resistor string and a pass transistor.

A transistor using single crystal silicon as a semiconductor can be used for the driver circuit SD1, for example. Alternatively, a transistor using an oxide semiconductor film can be used for the driver circuit SD1, for example.

A transistor using an oxide semiconductor film can be used for a logic circuit using a pass transistor, for example. Therefore, the surface unevenness of a semiconductor film can be smaller than that of a polysilicon film on which ridges are formed by laser crystallization, for example. Alternatively, a thin insulating film having a thickness of approximately 20 nm can be used for a gate insulating film. Alternatively, the drive capability of the transistor using an oxide semiconductor film can be improved. Alternatively, the operation speed can be made higher than that of a logic circuit or the like formed of a transistor using polysilicon.

Structure Example 3 of Display Panel 700(*p*.*q*)

The display panel 700(*p*,*q*) described in this embodiment includes the pixel 702(0 (see FIG. 6(A)).

<<Structure Example 1 of Pixel 702(*i*,*j*)>>

The pixel 702(*i*,*j*) includes a functional layer 520 and a display element 550(*i*,*j*) (see FIG. 7(A)).

<<Structure Example 1 of Functional Layer 520>>

The functional layer 520 includes the pixel circuit 530(*i*, *j*).

<<Structure Example 1 of Pixel Circuit 530(*i*,*j*)>>

The pixel circuit 530(*i*,*j*) is electrically connected to the display element 550(*i*,*j*) (see FIG. 7(A) and FIG. 7(B)).

For example, the pixel circuit 530(*i*,*j*) is electrically connected to the display element 550(*i*,*j*) in an opening portion 591A(i,j) (see FIG. 8(A)).

A switch, a transistor, a diode, a resistor, an inductor, a capacitor, or the like can be used in the pixel circuit 530(*i*,*j*), for example.

The pixel circuit 530(*i*,*j*) includes a switch SW2 and a capacitor C21.

For example, a transistor can be used as the switch SW2.

<<Structure Example 1 of Switch SW2>>

A transistor having the same structure as a transistor M can be used as the switch SW2 (see FIG. 8(A) and FIG. 8(B)). Thus, the switch SW2 and the transistor M can be fabricated through the same process.

Note that the size and the like of the transistor M can be designed such that it obtains a higher current drive capability than the transistor used as the switch SW2. Alternatively, the size and the like of the transistor used as the switch SW2 can be designed such that the current flowing in the non-conduction state is suppressed.

The transistor includes a semiconductor film 508, a conductive film 504, a conductive film 512A, and a conductive film 512B (see FIG. 8(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The conductive film 524 includes a region between which and the conductive film 504 the semiconductor film 508 is sandwiched. The conductive film 524 has a function of a second gate electrode. The conductive film 524 can be electrically connected to the conductive film 504, for example.

Note that semiconductor films that can be formed in the same step can be used for transistors in the driver circuit and the pixel circuit, for example.

For example, a bottom-gate transistor, a top-gate transistor, or the like can be used for a transistor in the driver circuit or a transistor in the pixel circuit.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. Alternatively, for example, the drive capability can be higher than that of a transistor using hydrogenated amorphous silicon for the semiconductor film 508. Alternatively, for example, the aperture ratio of the pixel can be higher than that in the case of a transistor using hydrogenated amorphous silicon for the semiconductor film 508.

Alternatively, for example, the reliability of the transistor can be higher than that of a transistor using hydrogenated amorphous silicon for the semiconductor film 508.

Alternatively, the temperature required for manufacture of the transistor can be lower than that required for a transistor using single crystal silicon, for example.

Alternatively, the semiconductor film used for the transistor in the driver circuit can be formed in the same process as the semiconductor film used for the transistor in the pixel circuit. Alternatively, the driver circuit can be formed over the same substrate as the substrate which the pixel circuit is formed. Alternatively, the number of components included in an electronic device can be reduced.

[Single Crystal Silicon]

For example, single crystal silicon can be used for the semiconductor film. In this case, for example, the resolution can be higher than that of a display panel using hydrogenated amorphous silicon for the semiconductor film 508. Alternatively, for example, a display panel having less display unevenness than a display panel using polysilicon for the semiconductor film 508 can be provided. Alternatively, for example, smart glasses or a head mounted display can be provided.

<<Structure Example 2 of Semiconductor Film 508>>

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon in a semiconductor film can be used, for example. Specifically, a transistor using an oxide semiconductor in a semiconductor film can be used.

Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute while occurrence of flickers is suppressed. Consequently, fatigue accumulation in a user of a data processing device can be reduced. Moreover, power consumption associated with driving can be reduced.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region between which and the insulating film 506 the film containing tantalum and nitrogen is sandwiched.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region between which and the semiconductor film 508 the film containing silicon, oxygen, and nitrogen is sandwiched.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon as a semiconductor can be easily remodeled into a manufacturing line for a bottom-gate transistor using an oxide semiconductor as a semiconductor, for example. Furthermore, for example, a manufacturing line for a top-gate transistor using polysilicon as a semiconductor can be easily remodeled into a manufacturing line for a top-gate transistor using an oxide semiconductor as a semiconductor. In either remodeling, a conventional manufacturing line can be effectively utilized.

This can suppress flickering. Alternatively, the power consumption can be reduced. Alternatively, a moving image with quick movements can be smoothly displayed.

Alternatively, a photograph and the like can be displayed in a wide range of grayscale. As a result, a novel display panel that is highly convenient or reliable can be provided.

<<Structure Example 3 of Semiconductor Film 508>>

For example, a compound semiconductor can be used for the semiconductor film 508. Specifically, a semiconductor containing gallium arsenide can be used.

For example, an organic semiconductor can be used for the semiconductor film 508. Specifically, an organic semiconductor containing polyacene or graphene can be used. Thus, the semiconductor film can be formed by a printing method or an ink-jet method, for example. Alternatively, the semiconductor film can be fabricated by an inexpensive method.

<<Structure Example 1 of Display Element 550($i,j$)>>

The display element 550($i,j$) has a function of emitting light.

The display element 550($i,j$) includes a layer 553($j$) containing a light-emitting material (see FIG. 8(A)).

A display element having a function of emitting light, for example, can be used as the display element 550($i,j$). Specifically, an organic electroluminescence element, an inorganic electroluminescence element, a light-emitting diode, a QDLED (Quantum Dot LED), or the like can be used as the display element 550($i,j$).

<<Structure Example 1 of Layer 553($j$) Containing Light-Emitting Material>>

A belt-like layered material that is long in the column direction along the signal line S1($j$) can be used for the layer 553($j$) containing a light-emitting material, for example.

Specifically, materials emitting light with different hues can be used for the layer 553($j$) containing a light-emitting material, the layer 553($j+1$) containing a light-emitting material, and the layer 553($j+2$) containing a light-emitting material. Thus, for example, the hue of the light emitted from the display element 550($i,j$) can be different between columns.

For example, a material that emits blue light, a material that emits green light, and a material that emits red light can be used for the materials emitting light with different hues.

<<Structure Example 2 of Layer 553(j) Containing Light-Emitting Material>>

A layered material stacked to emit white light can be used for the layer 553(j) containing a light-emitting material, for example.

Specifically, materials which emit light with different hues can be used for the layer 553(j) containing a light-emitting material.

For example, a layered material in which a layer containing a light-emitting material including a fluorescent material that emits blue light, and a layer containing materials that are other than a fluorescent material and that emit green light and red light are stacked can be used for the layer 553(j) containing a light-emitting material. Alternatively, a stacked-layer material in which a layer containing a material that is other than a fluorescent material and that emits yellow light is stacked can be used for the layer 553(j) containing a light-emitting material.

A light-emitting unit can be used for the layer 553(j) containing a light-emitting material, for example. The light-emitting unit includes one region where the electrons injected from one side are recombined with the holes injected from the other side. The light-emitting unit contains a light-emitting material, and the light-emitting material releases the energy generated by recombination of electrons and holes as light.

A plurality of light-emitting units and an intermediate layer can be used for the layer 553(j) containing a light-emitting material, for example. The intermediate layer includes a region sandwiched between two light-emitting units. The intermediate layer includes a charge-generation region and has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

For example, a light-emitting unit including a material emitting light with one hue and a light-emitting unit including a material emitting light with a different hue can be used for the layer 553(j) containing a light-emitting material.

For example, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used for the layer 553(j) containing a light-emitting material.

<<Electrode 551(i,j) and Electrode 552>>

An electrode 551(i,j) is electrically connected to the pixel circuit 530(i,j) in the opening portion 591A(i,j) (see FIG. 8(A)).

For example, the material that can be used for the wiring or the like can be used for the electrode 551(i,j) or an electrode 552. Specifically, a material that has a light-transmitting property with respect to visible light can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a light-transmitting property with respect to visible light can be used.

For example, a metal film that transmits part of light and reflects another part of the light can be used for the electrode 551(i,j) or the electrode 552. Thus, for example, the distance between the electrode 551(i,j) and the electrode 552 can be adjusted. Alternatively, a microcavity structure can be provided in the display element 550(0. Alternatively, light of a predetermined wavelength can be extracted more efficiently than other light. Alternatively, light with a narrow half width of a spectrum can be extracted. Alternatively, light of a bright color can be extracted.

For example, a film that reflects light efficiently can be used for the electrode 551(i,j) or the electrode 552. Specifically, a material containing silver, palladium, and the like or a material containing silver, copper, and the like can be used for the metal film.

<<Structure Example 2 of Pixel Circuit 702(i,j)>>

The display region 231 includes a plurality of pixels. For example, pixels having a function of displaying colors with different hues can be used for the display region 231. Alternatively, colors with hues that cannot be displayed by each of the plurality of pixels can be displayed by additive color mixture with the use of the plurality of pixels.

Note that when a plurality of pixels capable of displaying colors with different hues are used for color mixture, each of the pixels can be rephrased as a subpixel. In addition, a set of subpixels can be rephrased as a pixel.

For example, the pixel 702(i,j) can be rephrased as a subpixel, and a set of the pixel 702(i,j), a pixel 702(i,j+1), and a pixel 702(i,j+2) can be rephrased as a pixel 703(i,k) (see FIG. 6(C)).

Specifically, a set of a subpixel that displays blue, a subpixel that displays green, and a subpixel that displays red can be used as the pixel 703(i,k). A set of a subpixel that displays cyan, a subpixel that displays magenta, and a subpixel that displays yellow can be used as the pixel 703(i,k).

Furthermore, the above set to which a subpixel that displays white or the like is added can be used as the pixel, for example.

Structure Example 4 of Display Panel 700(p.q)

The display panel 700(p.q) also includes the display region 231 (see FIG. 6(A)).

<<Structure Example 1 of Display Region 231>>

The display region 231 includes the pixel 702(i,j), the pixel 702(i,j+1), and the pixel 702(i,j+2) (see FIG. 6(C)).

The pixel 702(i,j) emits light of a color that has a chromaticity x of greater than 0.680 and less than or equal to 0.720 and a chromaticity y of greater than or equal to 0.260 and less than or equal to 0.320 in the CIE 1931 chromaticity coordinates.

The pixel 702(i,j+1) emits light of a color that has a chromaticity x of greater than or equal to 0.130 and less than or equal to 0.250 and a chromaticity y of greater than 0.710 and less than or equal to 0.810 in the CIE 1931 chromaticity coordinates.

The pixel 702(i,j+2) emits light that has a chromaticity x of greater than or equal to 0.120 and less than or equal to 0.170 and a chromaticity y of greater than or equal to 0.020 and less than 0.060 in the CIE 1931 chromaticity coordinates.

The pixel 702(i,j), the pixel 702(i,j+1), and the pixel 702(i,j+2) are provided so that the area ratio of their color gamut to the BT.2020 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

<<Structure Example 2 of Display Region 231>>

The display region 231 includes a plurality of pixels in a matrix. For example, the display region 231 includes 7600 or more pixels in the row direction and 4300 or more pixels in the column direction. For example, 7680 pixels are provided in the row direction and 4320 pixels are provided in the column direction.

Note that display regions of a plurality of display panels can also be arranged in a tiled pattern to form one display region.

The display region 231 can perform display at a frame frequency of, for example, higher than or equal to 60 Hz or preferably higher than or equal to 120 Hz. Alternatively, display can be performed at a frame frequency of 120 Hz by a progressive method. Alternatively, extremely high-resolution display satisfying Recommendation ITU-R BT.2020-2, which is an international standard, can be performed. Alternatively, extremely high-resolution display can be performed.

Structure Example 5 of Display Panel 700($p$.q)

The display panel 700($p$.q) includes a base 510, a base 770, and the functional layer 520 (see FIG. 8(A)).

Note that the functional layer 520 includes a region sandwiched between the base 510 and the base 770.

<<Base 510 and Base 770>>

A light-transmitting material can be used for the base 510 or the base 770.

A material whose surface on one side is provided with an antireflective film with a thickness of 1 µm or less can be used. Specifically, a stacked-layer film in which three or more layers, preferably five or more layers, more preferably 15 or more layers of dielectrics are stacked can be used for the base 770. This allows the reflectivity to be as low as 0.5% or less, preferably 0.08% or less.

For example, a material having heat resistance high enough to withstand heat treatment in the manufacturing process can be used for the base 510 or the base 770. For example, a material with a thickness less than or equal to 0.7 mm and greater than or equal to 0.1 mm can be used. Specifically, a material polished to a thickness of approximately 0.1 mm can be used. As a result, the weight can be reduced.

For example, a large-sized glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), the 11th generation (3000 mm×3320 mm), or the like can be used as the base 510 or the base 770. Thus, a large-sized display device can be manufactured.

For the base 510 or the base 770, an organic material, an inorganic material, a composite material of an organic material and an inorganic material or the like, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base 510 or the base 770. Alternatively, aluminosilicate glass, tempered glass, chemically tempered glass, sapphire, or the like can be suitably used for the base 510 or the base 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base 510 or the base 770.

For example, a single crystal semiconductor substrate of silicon or silicon carbide, a polycrystalline semiconductor substrate, a compound semiconductor substrate of silicon germanium or the like, an SOI substrate, or the like can be used as the base 510 or the base 770. Thus, a semiconductor element can be formed over the base 510 or the base 770.

For example, an organic material such as a resin, a resin film, or plastic can be used for the base 510 or the base 770. Specifically, a resin film or a resin plate of polyester, polyolefin, polyamide, polyimide, polycarbonate, an acrylic resin, or the like can be used. As a result, the weight can be reduced. Alternatively, for example, the frequency of occurrence of breakage due to dropping or the like can be reduced.

For example, a composite material formed by attaching a metal plate, a thin glass plate, or a film of an inorganic material or the like to a resin film or the like can be used for the base 510 or the base 770. For example, a composite material formed by dispersing a fibrous or particulate metal, glass, an inorganic material, or the like into a resin film can be used. For example, a composite material formed by dispersing a fibrous or particulate resin, an organic material, or the like into an inorganic material can be used.

Furthermore, a single-layer material or a material in which a plurality of layers are stacked can be used for the base 510 or the base 770. For example, a material in which a base, an insulating film that prevents diffusion of impurities contained in the base, and the like are stacked can be used. Specifically, a material in which glass and one or a plurality of films selected from a silicon oxide layer, a silicon nitride layer, a silicon oxynitride layer, and the like that prevent diffusion of impurities contained in the glass are stacked can be used. Alternatively, a material in which a resin and a silicon oxide film, a silicon nitride film, a silicon oxynitride film, or the like that prevents diffusion of impurities that penetrate the resin are stacked can be used.

Specifically, a material containing polyester, polyolefin, polyamide (nylon, aramid, or the like), polyimide, polycarbonate, polyurethane, an acrylic resin, an epoxy resin, or a resin having a siloxane bond, such as silicone, can be used for the base 510 or the base 770. For example, a resin film, a resin plate, a stacked-layer material, or the like containing any of these resins can be used.

Specifically, polyethylene terephthalate (PET), polyethylene naphthalate (PEN), polyethersulfone (PES), a cycloolefin polymer (COP), a cycloolefin copolymer (COC), or the like can be used for the base 510 or the base 770.

Furthermore, paper, wood, or the like can be used for the base 510 or the base 770.

For example, a flexible material can be used for the base 510 or the base 770.

For example, a method in which a transistor, a capacitor, or the like is directly formed on a substrate can be used. Alternatively, a method in which a transistor, a capacitor, or the like is formed on a substrate which is for use in the process and has heat resistance to heat applied in the manufacturing process, and the formed transistor, capacitor, or the like is transferred to the base 510 or the base 770, for example, can be used. Accordingly, a transistor, a capacitor, or the like can be formed on a flexible substrate, for example.

<<Structure Example 2 of Functional Layer 520>>

The functional layer 520 includes an insulating film 521, an insulating film 518, an insulating film 516, the insulating film 506, and an insulating film 501D. Alternatively, an insulating film 501C, an insulating film 501A, an insulating film 528, and the like are provided.

[Insulating Film 521]

The insulating film 521 includes a region sandwiched between the pixel circuit 530($i,j$) and the display element 550($i,j$) (see FIG. 8(A)).

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a layered material in which a plurality of films selected from these are stacked can be used as the insulating film 521.

For example, a silicon oxide film, a silicon nitride film, a silicon oxynitride film, an aluminum oxide film, or the like, or a film including a layered material in which a plurality of films selected from these are stacked can be used as the insulating film 521. Note that the silicon nitride film is a dense film and has an excellent function of suppressing diffusion of impurities.

For example, for the insulating film 521, polyester, polyolefin, polyamide, polyimide, polycarbonate, polysiloxane, an acrylic resin, or the like, or a layered material, a composite material, or the like of a plurality of resins selected from these can be used. Alternatively, a photosensitive material may be used for the formation. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, high chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, photosensitive acrylic, or the like can be used as the insulating film 521.

For example, a material having a light-transmitting property can be used for the insulating film 521. Specifically, silicon nitride can be used for the insulating film 521.

[Insulating Film 518]

The insulating film 518 includes a region sandwiched between the pixel circuit 530($i,j$) and the insulating film 521 (see FIG. 8(B)). Note that a stacked-layer film can be used as the insulating film 518.

The material that can be used for the insulating film 521, for example, can be used for the insulating film 518.

For example, a material that has a function of suppressing diffusion of oxygen, hydrogen, water, an alkali metal, an alkaline earth metal, and the like can be used for the insulating film 518. Specifically, a nitride insulating film can be used for the insulating film 518. For example, silicon nitride, silicon nitride oxide, aluminum nitride, aluminum nitride oxide, or the like can be used for the insulating film 518. Thus, impurity diffusion to a semiconductor film of the transistor can be suppressed.

[Insulating Film 516]

The insulating film 516 includes a region sandwiched between the pixel circuit 530($i,j$) and the insulating film 518 (see FIG. 8(B)). Note that a stacked-layer film can be used as the insulating film 516. Specifically, an insulating film in which the insulating film 516A and the insulating film 516B are stacked can be used as the insulating film 516.

The material that can be used for the insulating film 521, for example, can be used for the insulating film 516. Specifically, a film formed by a manufacturing method different from that of the insulating film 518 can be used for the insulating film 516.

[Insulating Film 506]

Note that the insulating film 506 includes a region sandwiched between the semiconductor film 508 and the conductive film 504 (see FIG. 8(B)).

The material that can be used for the insulating film 521, for example, can be used for the insulating film 506. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used for the insulating film 506.

[Insulating Film 501D]

The insulating film 501D includes a region sandwiched between the insulating film 501C and the insulating film 516 (see FIG. 8(B)).

The material that can be used for the insulating film 506, for example, can be used for the insulating film 501D.

[Insulating Film 501C]

The insulating film 501C includes a region sandwiched between the pixel circuit 530($i,j$) and the base 510 (see FIG. 8(A)).

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be suppressed.

[Insulating Film 501A]

The material that can be used for the insulating film 521, for example, can be used for the insulating film 501A. Alternatively, for example, a material having a function of supplying hydrogen can be used for the insulating film 501A. Alternatively, polyimide or the like can be used for the insulating film 501A.

Specifically, a material in which a material containing silicon and oxygen and a material containing silicon and nitrogen are stacked can be used for the insulating film 501A. For example, a material having a function of releasing hydrogen by heating or the like to supply the released hydrogen to another component can be used for the insulating film 501A. Specifically, a material having a function of releasing hydrogen taken in the manufacturing process, by heating or the like, to supply the hydrogen to another component can be used for the insulating film 501A.

For example, a film containing silicon and oxygen that is formed by a chemical vapor deposition method using silane or the like as a source gas can be used as the insulating film 501A.

Specifically, a material in which a material with a thickness greater than or equal to 200 nm and less than or equal to 600 nm that contains silicon and oxygen and a material with a thickness of approximately 200 nm that contains silicon and nitrogen are stacked can be used for the insulating film 501A.

[Insulating Film 528]

The insulating film 528 includes a region sandwiched between the insulating film 521 and the base 770 and has an opening portion in a region overlapping with the display element 550(i,j) (see FIG. 8(A)). The insulating film 528 formed along the periphery of the electrode 551(i,j) prevents a short circuit between the electrode 551(i,j) and the electrode 552.

The material that can be used for the insulating film 521, for example, can be used for the insulating film 528. Specifically, a silicon oxide film, a film containing an acrylic resin, or a film containing polyimide can be used as the insulating film 528.

<<Wiring, Terminal, and Conductive Film>>

A material having conductivity can be used for a wiring or the like. Specifically, a material having conductivity can be used for the signal line S1(j), the scan line G1(i), a conductive film ANO, a terminal, or the like.

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like. Specifically, a nanowire containing silver can be used.

Specifically, a conductive polymer can be used for the wiring or the like.

Note that the terminal 519B(j) can be electrically connected to a flexible printed circuit FPC1 using a conductive material ACF1, for example (see FIG. 5). Specifically, the terminal can be electrically connected to the flexible printed circuit FPC1 using a conductive material CP. The terminal 519A(j) of the display panel 700(p,q) can be electrically connected to a terminal 519C(j) of a display panel 700(p+1,q) using the conductive material CP.

<<Sealant 705>>

The sealant 705 includes a region sandwiched between the functional layer 520 and the base 770, and has a function of bonding the functional layer 520 and the base 770 together.

For the sealant 705, an inorganic material, an organic material, a composite material of an inorganic material and an organic material, or the like can be used.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Bonding Layer 505>>

A bonding layer 505 includes a region sandwiched between the functional layer 520 and the base 510, and has a function of bonding the functional layer 520 and the base 510 together.

For example, the material that can be used for the sealant 705 can be used for the bonding layer 505.

<<Functional Layer 720>>

A functional layer 720 includes a coloring film CF, an insulating film 771, and a light-blocking film BM.

The coloring film CF includes a region sandwiched between the base 770 and the display element 550(i,j).

The light-blocking film BM includes an opening portion in a region overlapping with the pixel 702(i,j).

<<Functional Film 770P, Functional Film 770D, and the Like>>

A functional film 770P includes a region overlapping with the display element 550(i,j).

An anti-reflection film, a polarizing film, a retardation film, a light diffusion film, a condensing film, or the like, for example, can be used as the functional film 770P.

Specifically, a circularly polarizing film can be used as the functional film 770P.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

Note that this embodiment can be combined with other embodiments in this specification as appropriate.

Embodiment 2

In this embodiment, a structure of a display device of one embodiment of the present invention will be described with reference to FIG. 1 and FIG. 9.

Structure Example 1 of Display Device

The display device described in this embodiment includes one group of a display panel 700(p,1) to a display panel 700(p,t) and another group of a display panel 700(1,q) to a display panel 700(s,q) (see FIG. 1(B)). Although a structure in which display panels are provided in a matrix of six rows and six columns is illustrated for describing an example of a structure in which display panels are provided in a matrix of s rows and t columns, the display device of one embodiment of the present invention is not limited to this structure.

The one group of the display panel 700(p,1) to the display panel 700(p,t) is arranged in a row direction and the one group of the display panel 700(p,1) to the display panel 700(p,t) includes the display panel 700(p,q). The display panel 700 described in Embodiment 1 can be used as the display panel 700(p,q), for example.

The another group of the display panel 700(1,q) to the display panel 700(s,q) is arranged in a column direction intersecting the row direction and the another group of the display panel 700(1,q) to the display panel 700(s,q) includes the display panel 700(p,q) and the display panel 700(p+1,q).

Structure Example 2 of Display Device

Another structure example of the display device described in this embodiment includes the display panel 700(p,q) and the display panel 700(p+1,q) (see FIG. 9). Although a structure in which display panels are provided in a matrix of two rows and one column is illustrated for describing an example of a structure in which display panels are provided in a matrix of s rows and t columns, the display device of one embodiment of the present invention is not limited to this structure.

The display panel 700(p,q) and the display panel 700(p+1,q) are arranged in a column direction (the direction indicated by the arrow C1 in the diagram).

<<Structure Example 1 of Display Panel 700(p+1,q)>>

The display panel 700(p+1,q) includes a terminal region 529C and the display region 231B. The display panel 700 described in Embodiment 1 can be used as the display panel 700(p+1,q), for example.

<<Terminal Region 529C>>

The terminal region 529C is provided outside the display region 231B and the terminal region 529C includes a region overlapping with the terminal region 529A.

The terminal region 529C includes one group of a terminal 519C(1) to a terminal 519C(n), and the one group of the terminal 519C(1) to the terminal 519C(n) includes the terminal 519C(j).

The terminal 519C(j) is electrically connected to a terminal 529(A) and the display region 231B is provided so that the display can be seen from a direction which display of the display region 231 can be seen.

In this manner, display panels of the one group can be provided close to each other. Alternatively, display regions of the display panels of the one group can be provided continuously. Alternatively, display panels of the another group can be provided close to each other. Alternatively, display regions of the display panels of the another group can be provided continuously.

Alternatively, a continuous image can be displayed on the one group of display panels. Alternatively, a continuous image can be displayed on the another group of display panels.

Alternatively, an image signal which is supplied to a second terminal of one display panel and which is to be displayed on another display panel can be supplied from a first terminal of the one display panel to a third terminal of the another display panel. Consequently, a novel display device that is highly convenient or reliable can be provided.

<<Structure Example 2 of Display Panel 700(p+1,q)>>

The display panel 700(p+1,q) includes a terminal region 529D.

<<Terminal Region 529D>>

The terminal region 529D is provided so as not to block the display region 231B and the terminal region 529D includes a region overlapping with the display region 231B. For example, the terminal region 529D can be provided with respect to the display region 231B in the same manner as the provision of the terminal region 529A with respect to the display region 231. In other words, the terminal region 529D is provided on the rear surface of the display region 231B.

The terminal region 529D includes one group of a terminal 519D(1) to a terminal 519D(n), and the one group of the terminal 519D(1) to the terminal 519D(n) includes a terminal 519D(j).

<<Display Region 231B>>

The display region 231B includes a pixel 702B(i,j) and a signal line S1B(j).

The signal line S1B(j) is electrically connected to the pixel 702B(i,j), the terminal 519C(j), and the terminal 519D (j).

In this manner, a fourth terminal can supply a signal supplied from the third terminal, for example. Alternatively, the signal supplied from the third terminal can be distributed to the fourth terminal and another pixel, for example.

Alternatively, the fourth terminal can be provided without reducing display quality. Alternatively, the fourth terminal can be hidden from a user. Alternatively, the light-transmitting property of the outside of the another display region is not reduced. Alternatively, the another display region can be made close to another object. Alternatively, the another display region can be aligned with another object. As a result, a novel display device that is highly convenient or reliable can be provided.

Structure Example 3 of Display Device

The display device described in this embodiment includes a control portion 238 (see FIG. 9).

<<Control Portion 238>>

The control portion 238 is supplied with image data V1 and control data CI.

The control portion 238 generates data V11 on the basis of the image data V1 and generates a control signal SP11 on the basis of the control data CI. The control portion 238 supplies the data V11 and the control signal SP11.

Specifically, the control portion 238 includes a control circuit 233, a decompression circuit 234, and an image processing circuit 235.

<<Control Circuit 233>>

The control circuit 233 has a function of generating and supplying the control signal SP11.

The control circuit 233 has a function of supplying the control signal SP11. For example, a clock signal, a timing signal, or the like can be used for the control signal SP11. Specifically, a start pulse for starting operation of the driver circuit GDA or the driver circuit SD1 can be used for the control signal SP11. Thus, operations of a plurality of driver circuits can be synchronized with each other.

A timing controller can be used for the control circuit 233, for example.

Note that the control circuit 233 can also be included in the display panel. The control circuit 233 mounted on a rigid substrate can be used for the display panel, for example. The control circuit 233 mounted on the rigid substrate can be electrically connected to the driver circuit with the use of a flexible printed circuit.

Specifically, the control circuit 233 mounted on the rigid substrate can be electrically connected to the driver circuit GDA. Furthermore, it can be electrically connected to the driver circuit SD1.

<<Decompression Circuit 234>>

The decompression circuit 234 has a function of decompressing the image data V1 which is supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data contained in the image data V1, for example.

The image processing circuit 235 has a function of generating the data V11 by correcting the image data V1 on the basis of a predetermined characteristics curve and a function of supplying the data V11, for example.

<<Structure Example 2 of Driver Circuit GDA>>

The driver circuit GDA generates a selection signal and a control signal SP12 on the basis of the control signal SP11.

The driver circuit GDA supplies the selection signal and the control signal SP12.

<<Structure Example 2 of Driver Circuit SD1>>

The driver circuit SD1 supplies an image signal on the basis of the data V11.

<<Structure Examples of Terminal Region 529A and Terminal Region 529C>>

The terminal region 529A includes a terminal 519A(0). The terminal 519A(0) is electrically connected to the driver circuit GDA and supplied with the control signal SP12.

The terminal region 529C includes a terminal 519C(0). The terminal 519C(0) is electrically connected to the terminal 519A(0).

<<Structure Example 2 of Display Panel 700(p+1,q)>>

The display panel 700(p+1,q) preferably includes a driver circuit GDB and a scan line G1B(j).

<<Structure Example of Driver Circuit GDB>>

The driver circuit GDB is electrically connected to the terminal 519C(0) and a scan line G1B(i).

The driver circuit GDB generates another selection signal on the basis of the control signal SP12 and supplies the signal.

<<Structure Example of Pixel 702B(i,j)>>

The pixel 702B(i,j) is electrically connected to the scan line G1B(i) and another signal line S1(j).

The pixel 702B(i,j) is supplied with the data V11 and the another selection signal.

Thus, operations of the first driver circuit to the third driver circuit can be synchronized with each other. Alternatively, the one group of display panels can display a continuous image in synchronization with each other. Alternatively, the another group of display panels can display a continuous image in synchronization with each other. Consequently, a novel display device that is highly convenient or reliable can be provided.

Note that this embodiment can be combined with other embodiments in this specification as appropriate.

Embodiment 3

In this embodiment, a structure of an input/output device of one embodiment of the present invention will be described with reference to FIG. 11.

Figure 11:
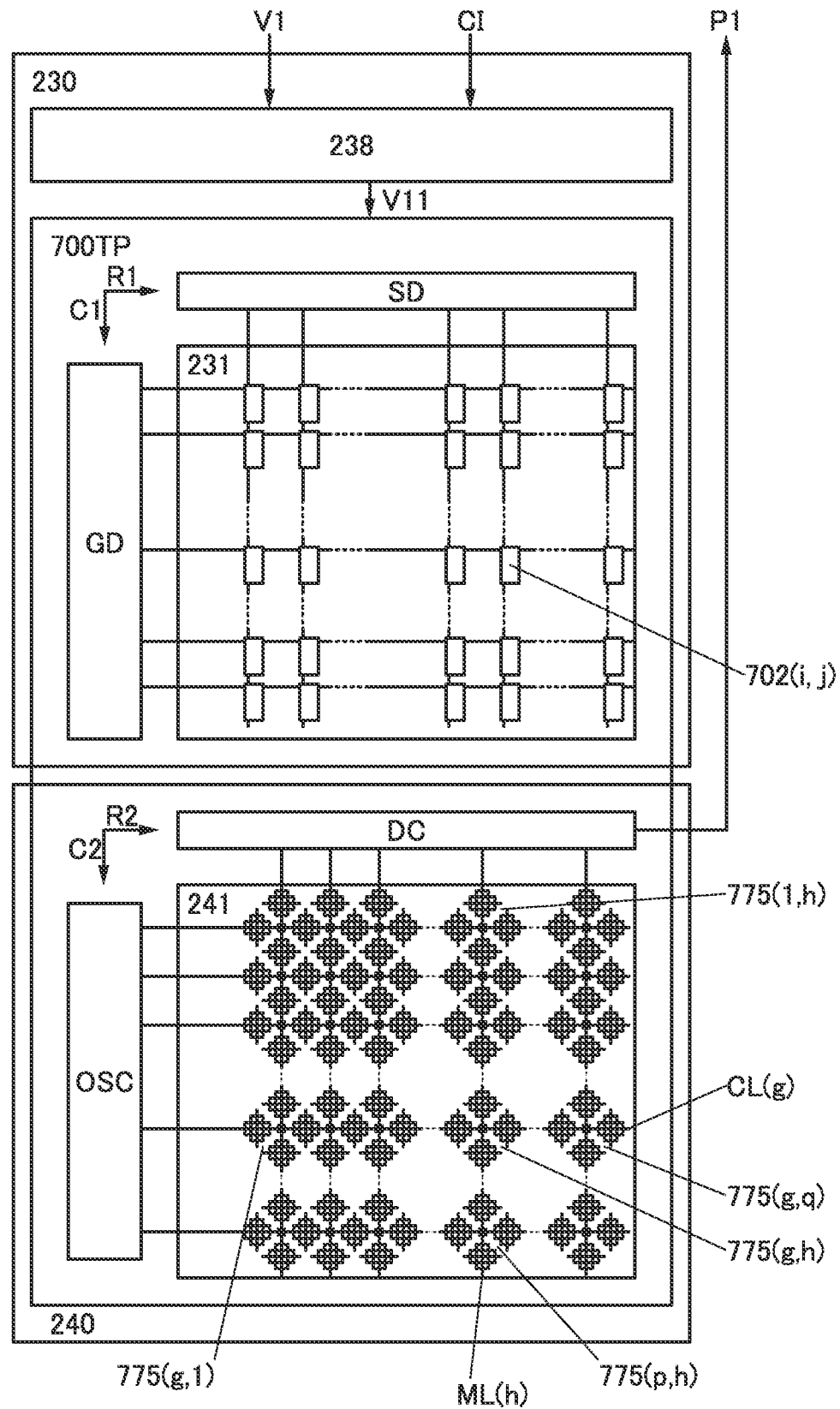
FIG. 11 A block diagram illustrating a structure of an input/output device of Embodiment.

FIG. 11 is a diagram illustrating the structure of the input/output device of one embodiment of the present invention.

Structure Example 1 of Input/Output Device

The input/output device described in this embodiment includes an input portion 240 and a display portion 230 (see FIG. 11).

<<Display Portion 230>>

For example, the display panel 700(p,q) described in Embodiment 1 or Embodiment 2 can be used for the display portion 230. Note that a structure including the input portion 240 and the display portion 230 can be referred to as an input/output panel 700TP.

<<Input Portion 240>>

The input portion 240 includes a sensing region 241. The input portion 240 senses an object approaching the sensing region 241.

The sensing region 241 includes a region overlapping with the pixel 702(i,j).

The input portion 240 can include an oscillation circuit OSC and a sensing circuit DC (see FIG. 11).

<<Sensing Region 241>>

The sensing region 241 can include one or more sensing elements, for example.

The sensing region 241 includes one group of a sensing element 775(g,1) to a sensing element 775(g,q) and another group of a sensing element 775(1,h) to a sensing element 775(p,h). Note that g is an integer greater than or equal to 1 and less than or equal to p, h is an integer greater than or equal to 1 and less than or equal to q, and p and q are each an integer greater than or equal to 1.

The one group of the sensing element 775(g,1) to the sensing element 775(g,q) includes a sensing element 775(g,h) and is arranged in the row direction (the direction indicated by an arrow R2 in the diagram). Note that the direction indicated by the arrow R2 may be the same as or different from the direction indicated by an arrow R1.

In addition, the another group of the sensing element 775(1,h) to the sensing element 775(p,h) includes the sensing element 775(g,h) and is arranged in the column direction (the direction indicated by an arrow C2 in the diagram) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can also be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 4

In this embodiment, a structure of a data processing device of one embodiment of the present invention will be described with reference to FIG. 12 to FIG. 15.

Figure 12A:
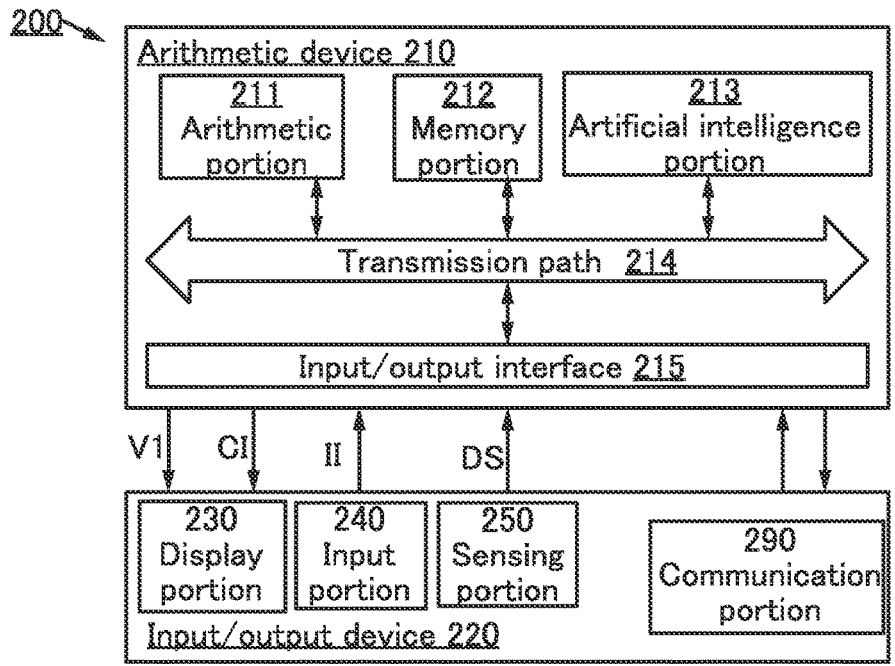
FIGS. 12A-12C A block diagram and projection views illustrating a structure of a data processing device of Embodiment.
Figure 12B:
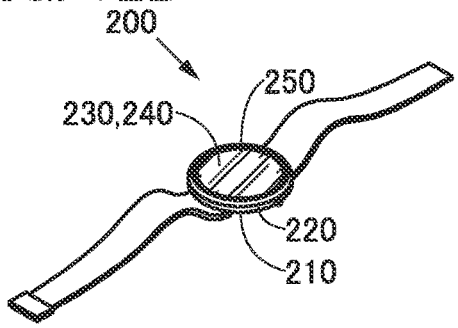
Figure 12C:
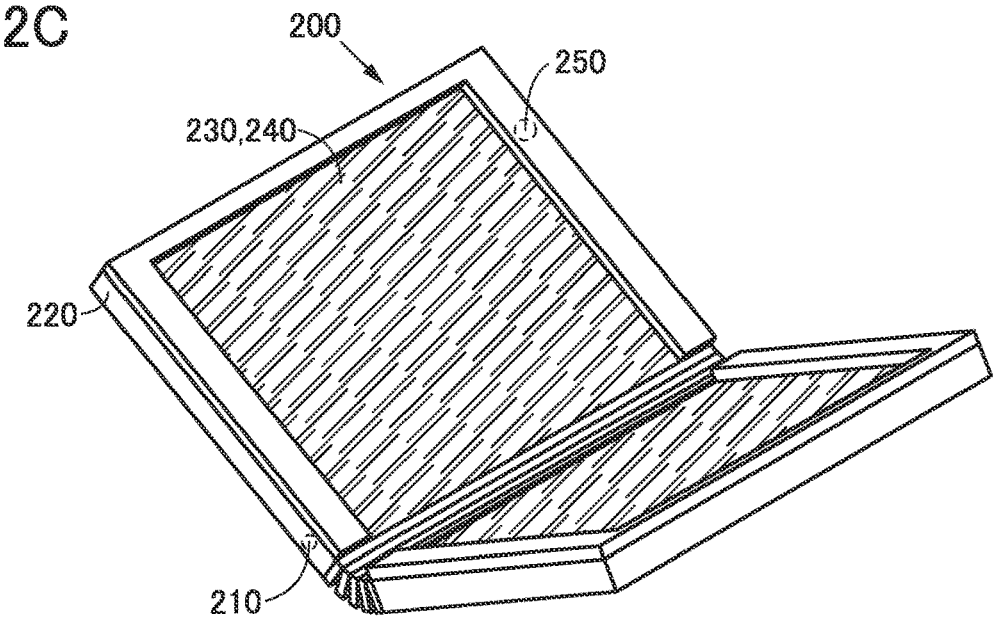

FIG. 12(A) is a block diagram illustrating the structure of the data processing device of one embodiment of the present invention. FIG. 12(B) and FIG. 12(C) are projection views each illustrating an example of the external view of a data processing device.

Figure 13A:
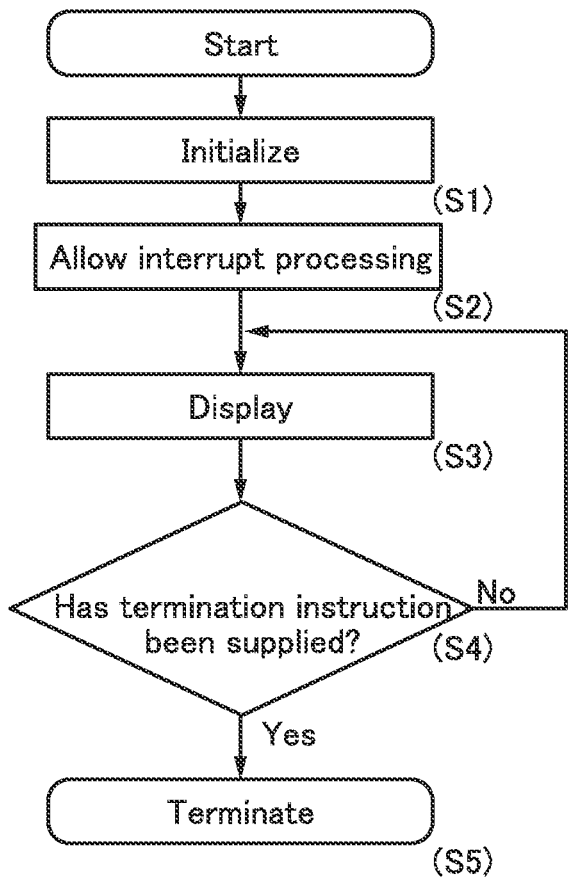
FIGS. 13A-13B Flow charts illustrating a method for driving a data processing device of Embodiment.
Figure 13B:
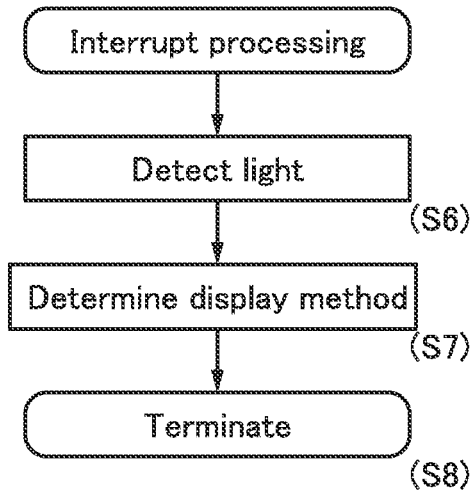

FIG. 13 is a flow chart illustrating a program of one embodiment of the present invention. FIG. 13(A) is a flow chart illustrating main processing of the program of one embodiment of the present invention, and FIG. 13(B) is a flow chart illustrating interrupt processing.

Figure 14A:
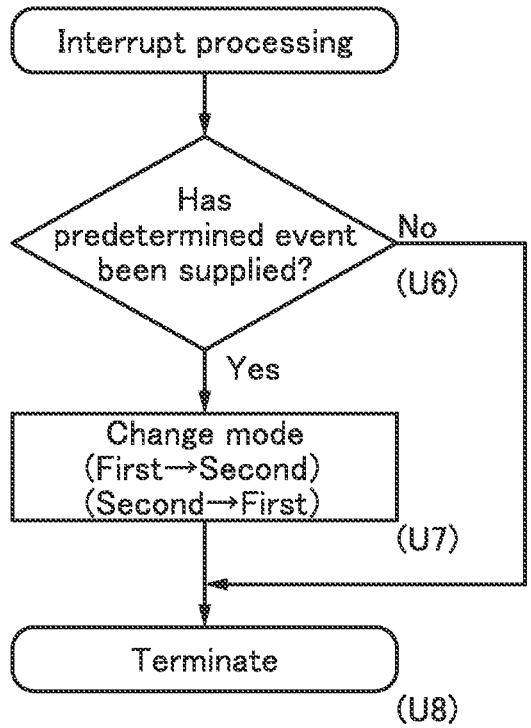
FIGS. 14A-14C Diagrams illustrating a method for driving a data processing device of Embodiment.
Figure 14B:
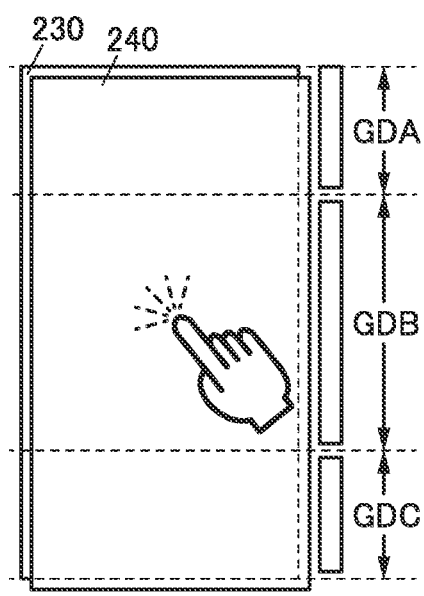
Figure 14C:
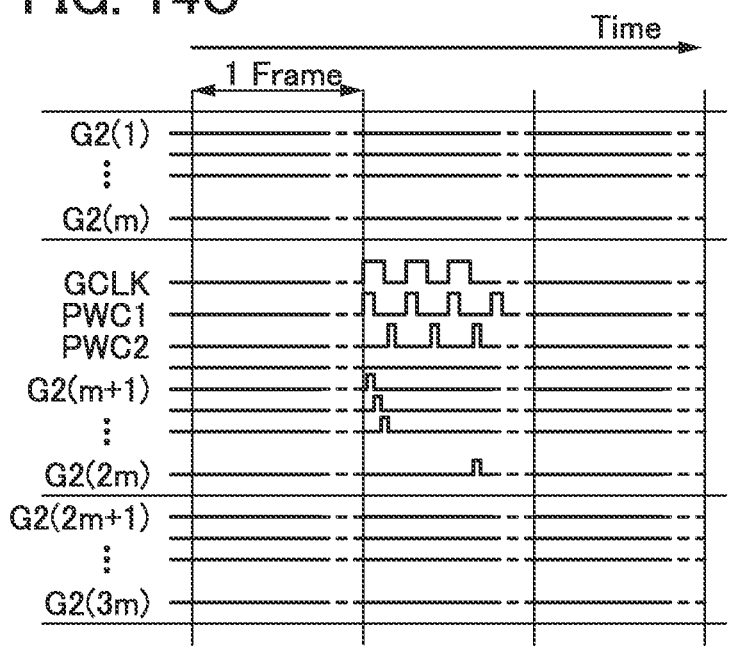

FIG. 14 is a diagram illustrating the program of one embodiment of the present invention. FIG. 14(A) is a flow chart illustrating interrupt processing of the program of one embodiment of the present invention. FIG. 14(B) is a schematic view illustrating operation of the data processing device and FIG. 14(C) is a timing chart illustrating operation of the data processing device of one embodiment of the present invention.

Figure 15A:
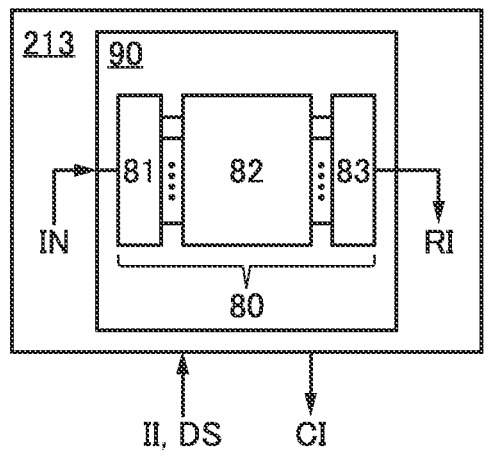
FIGS. 15A-15C Diagrams illustrating an artificial intelligence portion of a data processing device of Embodiment.
Figure 15B:
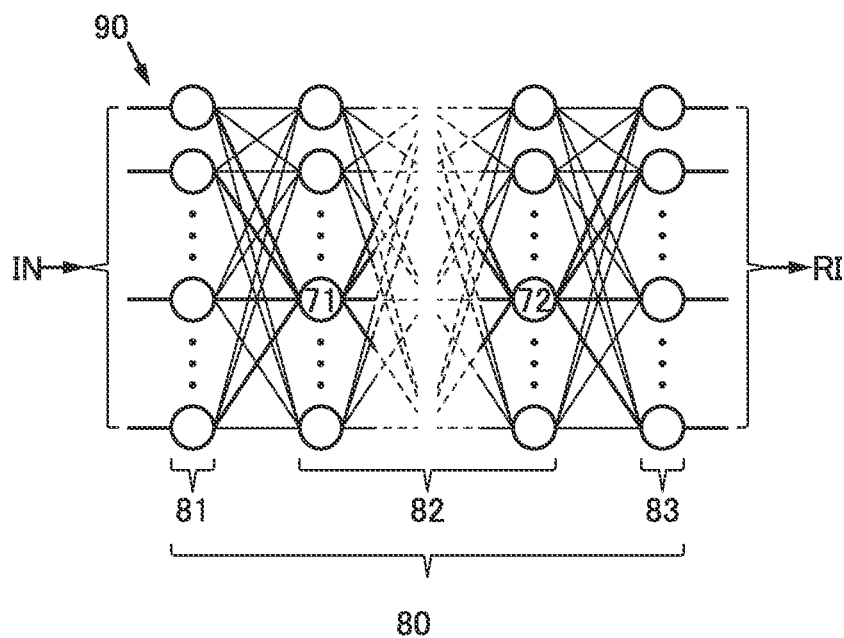
Figure 15C:
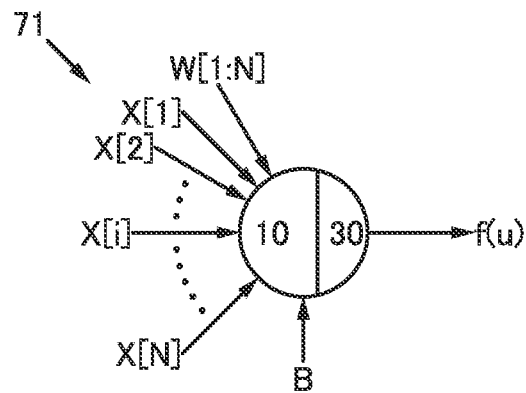

FIG. 15 is a diagram illustrating an artificial intelligence portion of one embodiment of the present invention. FIG. 15(A) is a block diagram illustrating the artificial intelligence portion of one embodiment of the present invention. FIG. 15(B) is a block diagram illustrating a neural network of one embodiment of the present invention. FIG. 15(C) is a block diagram illustrating a neuron circuit of one embodiment of the present invention.

Structure Example 1 of Data Processing Device

The data processing device described in this embodiment includes an arithmetic device 210 and an input/output device 220 (see FIG. 12(A)). Note that the input/output device is electrically connected to the arithmetic device 210. A data processing device 200 can also include a housing (see FIG. 12(B) or FIG. 12(C)).

<<Structure Example 1 of Arithmetic Device 210>>

The arithmetic device 210 is supplied with input data II or sensing data DS. The arithmetic device 210 supplies the control data CI and the image data V1.

The arithmetic device 210 includes an arithmetic portion 211 and a memory portion 212. The arithmetic device 210 also includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. Electrical connection to the transmission path 214 can be obtained, for example. Electrical connection to the input/output device 220 can also be obtained, for example.

The transmission path 214 includes a wiring and has a function of supplying data and being supplied with data. Electrical connection to the input/output interface 215 can be obtained, for example. Electrical connection to the arithmetic portion 211, the memory portion 212, or the input/output interface 215 can be obtained.

<<Structure Example of Input/Output Device 220>>

The input/output device 220 supplies the input data II and the sensing data DS. The input/output device 220 is supplied with the control data CI and the image data V1 (see FIG. 12(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used or the like can be used as the sensing data DS.

As the control data CI, for example, a signal controlling the luminance of display of the image data V1, a signal controlling the chroma of display of the image data V1, or a signal controlling the hue of display of the image data V1 can be used. Alternatively, a signal that changes display of part of the image data V1 can also be used as the control data CI.

The input/output device 220 includes the display portion 230, the input portion 240, and a sensing portion 250. For example, the input/output device described in Embodiment 3 can be used.

The display portion 230 displays the image data V1 on the basis of the control data CI.

The input portion 240 generates the input data II.

The sensing portion 250 generates the sensing data DS.

<<Display Portion 230>>

The display portion 230 has a function of displaying an image on the basis of the image data V1. The display portion 230 has a function of displaying an image on the basis of the control data CI.

The display portion 230 includes the control portion 238, a driver circuit GD, a driver circuit SD, and the display panel 700 (see FIG. 9). For example, any of the display devices described in Embodiment 2 can be used for the display portion 230.

<<Input Portion 240>>

The input portion 240 has a function of supplying positional data P1. A variety of human interfaces or the like can be used for the input portion 240 (see FIG. 12(A)).

For example, a keyboard, a mouse, a touch sensor, a microphone, a camera, or the like can be used as the input portion 240. Note that a touch sensor having a region overlapping with the display portion 230 can be used. An input/output device including the display portion 230 and a touch sensor having a region overlapping with the display portion 230 can be referred to as a touch panel or a touch screen.

A user can make various gestures (tap, drag, swipe, pinch in, or the like) using his/her finger touching the touch panel as a pointer, for example.

The arithmetic device 210, for example, analyzes data of the position, path, or the like of the finger in contact with the touch panel and can determine that a specific gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

<<Sensing Portion 250>>

The sensing portion 250 has a function of supplying the sensing data DS. The sensing portion 250 has a function of detecting the illuminance of the usage environment of the data processing device 200 and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photo-detector, an attitude detector, an acceleration sensor, a direction sensor, a GPS (Global positioning System) signal receiving circuit, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the data processing device can determine the intensity of light received by the housing of the data processing device and operate under the usage environment of the data processing device. Alternatively, a user of the data processing device can select a display method. Consequently, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 12(A)).

<<Structure Example 1 of Artificial Intelligence Portion 213>>

The artificial intelligence portion 213 generates the control data CI on the basis of the input data II or the sensing data DS (see FIG. 15(A)).

The artificial intelligence portion 213 includes a semiconductor device 90.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, or the like. The artificial intelligence portion 213 can generate data for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference RI with the use of the sensing data DS as data IN. Alternatively, the artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

<<Semiconductor Device 90>>

The semiconductor device 90 supplies the control data CI on the basis of the input data II or the sensing data DS.

The semiconductor device 90 is supplied with the data IN and supplies the inference RI (see FIG. 15(A) and FIG. 15(B)). For example, the input data II or the sensing data DS can be used as the data IN. Alternatively, for example, the inference RI can be used as the control data CI.

For example, the semiconductor device 90 can extract a feature from the input data II or the sensing data DS. The semiconductor device 90 can generate the control data CI on the basis of the extracted feature.

For example, the semiconductor device 90 can extract part of the input data II or the sensing data DS. The semiconductor device 90 can generate the control data CI such that the extracted part is displayed to be different from another part.

In this manner, the control data for display that can be felt suitable can be generated. Alternatively, display that can be felt suitable is possible. Alternatively, the control data for display that can be felt comfortable can be generated. Alternatively, display that can be felt comfortable is possible. Consequently, a novel data processing device that is highly convenient or reliable can be provided.

<<Structure Example 2 of Semiconductor Device 90>>

The semiconductor device 90 includes a neural network 80 (see FIG. 15(A)).

<<Neural Network 80>>

A convolutional neural network can be used as the neural network 80. Alternatively, a recurrent neural network can be used as the neural network 80. For example, the neural network 80 includes an input layer 81, an intermediate layer 82, and an output layer 83 (see FIG. 15(B)).

The input layer 81 includes a first group of neuron circuits.

The intermediate layer 82 includes a second group of neuron circuits.

The output layer 83 includes a third group of neuron circuits.

The second group of neuron circuits includes a first neuron circuit 71 and a second neuron circuit 72.

The first neuron circuit 71 is electrically connected to the first group of neuron circuits.

The second neuron circuit 72 is electrically connected to the third group of neuron circuits.

The first group of neuron circuits is supplied with the data IN. For example, the input data II or the sensing data DS can be used as the data IN.

The third group of neuron circuits supplies the inference RI. For example, the inference RI can be used as the control data CI.

<<Neuron Circuit 71>>

The neuron circuit 71 includes a product-sum operation unit 10 and a converter 30 (see FIG. 15(C)).

<<Product-Sum Operation Unit 10>>

The product-sum operation unit 10 is supplied with a group of an input signal X[1] to an input signal X[N]. The product-sum operation unit 10 is supplied with a group of weight data W[1] to weight data W[N]. The product-sum operation unit 10 is also supplied with a bias signal B.

By the product-sum operation unit 10, a product-sum signal U is generated on the basis of the bias signal B and the product-sum value of the group of the input signal X[1] to the input signal X[N] and the group of the weight data W[1] to the weight data W[N] and supplied. For example, a memory using a transistor which includes an oxide semiconductor or the like can be used for a memory for storing the weight data W[1] to the weight data W[N]. Specifically, a transistor that includes an oxide semiconductor containing indium or an oxide semiconductor containing indium, gallium, and zinc can be used for the memory. An analog arithmetic circuit can be used for the product-sum operation unit 10, for example. In this manner, the circuit scale can be small as compared with that of a digital arithmetic circuit. Alternatively, the power consumption can be reduced.

<<Converter 30>>

The converter 30 is electrically connected to the product-sum operation unit 10. By the converter 30, an output signal f(U) is generated on the basis of the product-sum signal U and supplied.

Structure Example 3 of Data Processing Device

Another structure of the data processing device of one embodiment of the present invention is described with reference to FIG. 13(A) and FIG. 13(B).

<<Program>>

The program of one embodiment of the present invention has the following steps (see FIG. 13(A)).

[First Step]

In a first step, setting is initialized (see (S1) in FIG. 13(A)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 13(A)). Note that an arithmetic device allowed to execute the interrupt processing can perform the interrupt processing in parallel with the main processing. The arithmetic device which has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed in a predetermined mode or a predetermined display method selected in the first step or the interrupt processing (see (S3) in FIG. 13(A)). Note that the predetermined mode identifies a mode for displaying the data, and the predetermined display method identifies a method for displaying image data. For example, the image data V1 can be used for data to be displayed.

One method for displaying the image data V1 can be associated with a first mode, for example. Alternatively, another method for displaying the image data V1 can be associated with a second mode. Thus, a display method can be selected on the basis of the selected mode.

<<First Mode>>

Specifically, a method for supplying selection signals to a scan line at a frequency of more than or equal to 30 Hz, preferably more than or equal to 60 Hz, and performing display on the basis of the selection signals can be associated with the first mode.

For example, selection signals are supplied at a frequency of more than or equal to 30 Hz, preferably more than or equal to 60 Hz, so that the movement of a moving image can be smoothly displayed.

For example, an image is refreshed at a frequency of more than or equal to 30 Hz, preferably more than or equal to 60 Hz, so that an image that changes so as to smoothly follow the user's operation can be displayed on the data processing device 200 the user is operating.

<<Second Mode>>

Specifically, a method for supplying selection signals to a scan line at a frequency of less than 30 Hz, preferably less than 1 Hz, further preferably less than once a minute and performing display on the basis of the selection signals can be associated with the second mode.

The supply of selection signals at a frequency of less than 30 Hz, preferably less than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be configured to emit light in a pulsed manner so that image data is displayed. Specifically, an organic EL element can be configured to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is suppressed, and thus the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see (S4) in FIG. 13(A)).

For example, the termination instruction supplied in the interrupt processing can be used for the determination.

[Fifth Step]

In the fifth step, the program terminates (see (S5) in FIG. 13(A)).

<<Interrupt Processing>>

The interrupt processing includes a sixth step to an eighth step described below (see FIG. 13(B)).

[Sixth Step]

In the sixth step, the illuminance of the environment where the data processing device 200 is used is detected using the sensing portion 250, for example (see (S6) in FIG. 13(B)). Note that color temperature or chromaticity of ambient light may be detected instead of the illuminance of the environment.

[Seventh Step]

In the seventh step, a display method is determined on the basis of the detected illuminance data (see (S7) in FIG. 13(B)). For example, a display method is determined such that the brightness of display is not too dark or too bright.

Note that in the case where the color temperature or chromaticity of the ambient light is detected in the sixth step, the color of display may be adjusted.

[Eighth Step]

In the eighth step, the interrupt processing terminates (see (S8) in FIG. 13(B)).

Structure Example 3 of Data Processing Device

Another structure of the data processing device of one embodiment of the present invention is described with reference to FIG. 14.

FIG. 14(A) is a flow chart illustrating a program of one embodiment of the present invention. FIG. 14(A) is a flow chart illustrating interrupt processing different from that illustrated in FIG. 13(B).

Note that the structure example 3 of the data processing device is different from the interrupt processing described with reference to FIG. 13(B) in that the interrupt processing includes a step in which a mode is changed on the basis of a supplied predetermined event. Different portions will be described in detail here, and the above description is referred to for portions that can use similar structures.

<<Interrupt Processing>>

The interrupt processing includes a sixth step to an eighth step described below (see FIG. 14(A)).

[Sixth Step]

In the sixth step, the program proceeds to the seventh step when a predetermined event has been supplied, whereas the program proceeds to the eighth step when the predetermined event has not been supplied (see (U6) in FIG. 14(A)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 14(A)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 14(B)).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 14(B) and FIG. 14(C)). Specifically, the frequency of the selection signal supplied from the driver circuit GDB can be changed in accordance with a "tap" event supplied to a touch panel with a finger or the like.

A signal GCLK is a clock signal controlling an operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2(2$m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 14(A)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged to be able to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. For example, educational materials distributed in a classroom of a school, a university, or the like can be received, so that the data processing device 200 can be used as a schoolbook or the like (see FIG. 12(C)). Alternatively, materials distributed in a conference room in, for example, a company can be received and used for a conference material.

Note that this embodiment can be combined with other embodiments in this specification as appropriate.

Embodiment 5

In this embodiment, structures of data processing devices of embodiments of the present invention will be described with reference to FIG. 16 and FIG. 17.

Figure 16A:
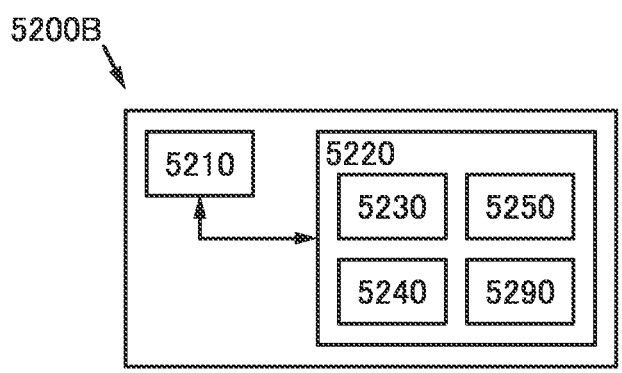
FIGS. 16A-16C Diagrams illustrating structures of a data processing device of Embodiment.
Figure 16B:
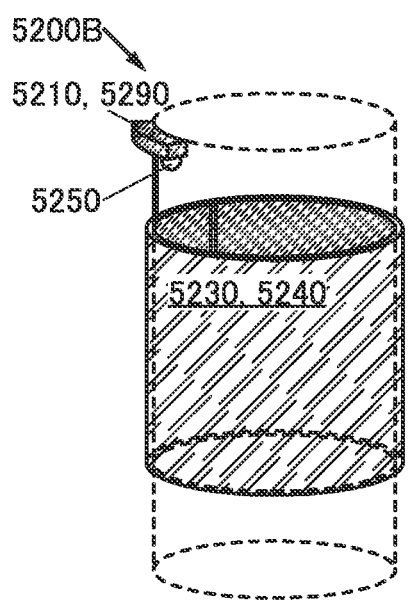
Figure 16C:
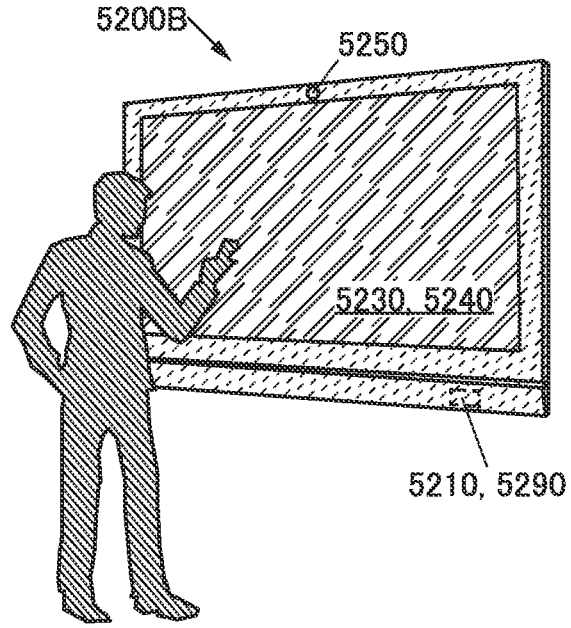
Figure 17:
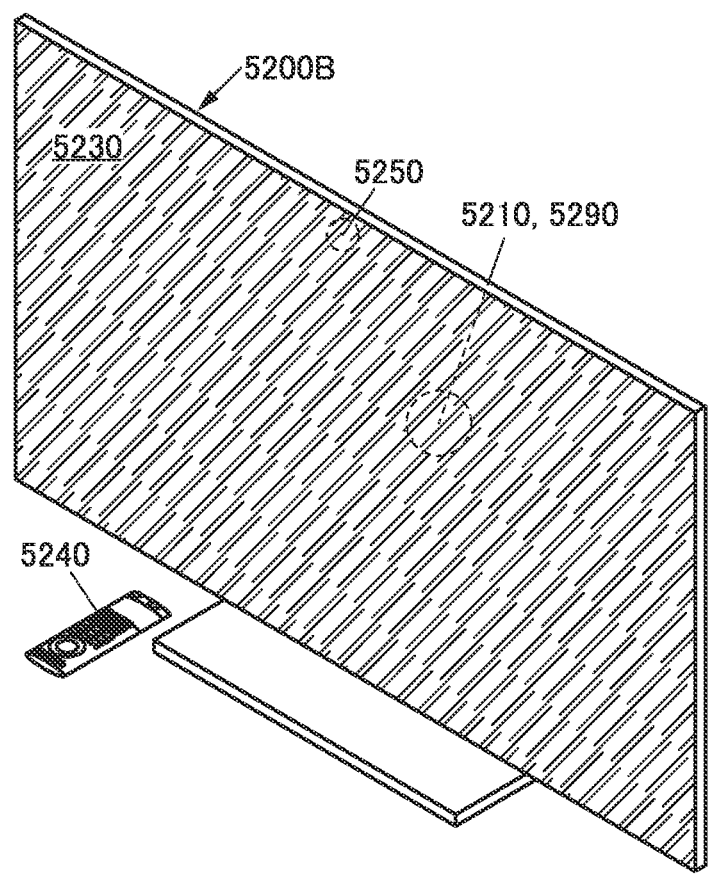
FIG. 17 A diagram illustrating a structure of a data processing device of Embodiment.

FIG. 16 and FIG. 17 are diagrams illustrating structures of the data processing devices of embodiments of the present invention. FIG. 16(A) is a block diagram of the data processing device, and FIG. 16(B) to FIG. 16(C) are perspective views illustrating structures of the data processing device. FIG. 17 is a perspective view illustrating a structure of the data processing device.

<Data Processing Device>

A data processing device 5200B described in this embodiment includes an arithmetic device 5210 and an input/output device 5220 (see FIG. 16(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used for the input portion 5240.

The display portion 5230 includes a display panel and has a function of displaying image data. For example, the display panel described in Embodiment 1 can be used for the display portion 5230.

The sensing portion 5250 has a function of supplying sensing data. For example, the sensing portion 5250 has a function of sensing a surrounding environment where the data processing device is used and supplying it as sensing data.

Specifically, an illuminance sensor, an imaging device, an attitude detection device, a pressure sensor, a human motion sensor, or the like can be used for the sensing portion 5250.

The communication portion 5290 has a function of being supplied with communication data and a function of supplying communication data. For example, the communication portion 5290 has a function of being connected to another electronic device or a communication network through wireless communication or wired communication.

Specifically, the communication portion 5290 has a function of wireless local area network communication, telephone communication, or near field communication, for example.

<<Structure Example 1 of Data Processing Device>>

For example, an outer shape along a cylindrical column or the like can be employed for the display portion 5230 (see FIG. 16(B)). The data processing device has a function of changing its display method in accordance with the illuminance of a usage environment. In addition, the data processing device has a function of sensing existence of a person to change the displayed content. This allows the data processing device to be provided on a column of a building, for example. Alternatively, the data processing device can display advertising, guidance, or the like. Alternatively, the data processing device can be used for digital signage or the like.

<<Structure Example 2 of Data Processing Device>>

For example, the data processing device has a function of generating image data on the basis of the path of a pointer used by a user (see FIG. 16(C)). Specifically, a display panel with a length of a diagonal line of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

<<Structure Example 3 of Data Processing Device>>

For example, the data processing device has a function of changing its display method in accordance with the illuminance of a usage environment (see FIG. 17). Accordingly, a television system can display an image such that the television system can be suitably used even when irradiated with strong external light that enters the room in fine weather.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relation shown in drawings or texts, a connection relationship other than one shown in drawings or texts is described in the drawings or the texts.

Here, X and Y each denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit configuration is defined by an expression similar to the above examples, a source (or a first terminal or the like) and a drain (or a second terminal or the like) of a transistor can be distinguished from each other to specify the technical scope.

Alternatively, as another expression, the expression "a source (or a first terminal or the like) of a transistor is electrically connected to X through at least a first connection path, the first connection path does not include a second connection path, the second connection path is a path through the transistor, between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" can be used. Alternatively, the expression "a source (or a first terminal or the like) of a transistor is electrically connected to X by at least a first connection path through Z1, the first connection path does not include a second connection path, the second connection path includes a connection path through the transistor, a drain (or a second terminal or the like) of the transistor is electrically connected to Y by at least a third connection path through Z2, and the third connection path does not include the second connection path" can also be used. Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ACF1: conductive material, ANO: conductive film, B: bias signal, C21: capacitor, CI: control data, CP: conductive material, DS: sensing data, f: output signal, FPC1: flexible printed circuit, G1: scan line, G1B: scan line, G2: scan line, GCLK: signal, GD: driver circuit, GDA: driver circuit, GDB: driver circuit, GDC: driver circuit, II: input data, IN: data, P1: positional data, PWC1: signal, PWC2: signal, S1: signal line, S1B: signal line, SD: driver circuit, SD1: driver circuit, SP11: control signal, SP12: control signal, SW2: switch, U: product-sum signal, V1: image data, V11: data, W: weight data, X: input signal, 30: converter, 71: neuron circuit, 72: neuron circuit, 80: neural network, 81: input layer, 82: intermediate layer, 83: output layer, 90: semiconductor device, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 231B: display region, 233: control circuit, 234: decompression circuit, 235: image processing circuit, 238: control portion, 240: input portion, 241: sensing region, 248: control portion, 250: sensing portion, 290: communication portion, 400: molecular weight, 501A: insulating film, 501C: insulating film, 501D: insulating film, 504: conductive film, 505: bonding layer, 506: insulating film, 508: semiconductor film, 508A: region, 508B: region, 508C: region, 510: base, 512A: conductive film, 512B: conductive film, 516: insulating film, 516A: insulating film, 516B: insulating film, 518: insulating film, 519A: terminal, 519B: terminal, 519C: terminal, 519D: terminal, 520: functional layer, 521: insulating film, 524: conductive film, 528: insulating film, 529: terminal, 529A: terminal region, 529B: terminal region, 529C: terminal region, 529D: terminal region, 530: pixel circuit, 550: display element, 551: electrode, 552: electrode, 553: layer containing light-emitting material, 591A: opening portion, 700: display panel, 700TP: input/output panel, 702: pixel, 702B: pixel, 703: pixel, 705: sealant, 720: functional layer, 770: base, 770D: functional film, 770P: functional film, 771: insulating film, 775: sensing element, 5200B: data processing device, 5210: arithmetic device, 5220: input/output device, 5230: display portion, 5240: input portion, 5250: sensing portion, 5290: communication portion,

The invention claimed is:

1. A display panel comprising:
a display region;
a first terminal region; and
a second terminal region,
wherein the first terminal region is provided on a rear side of the display region,
wherein the first terminal region comprises a region overlapping with the display region,
wherein the first terminal region comprises a first group of terminals,
wherein the first group of terminals comprises a first terminal,
wherein the second terminal region is provided outside of the display region and comprises a second group of terminals,
wherein the second group of terminals comprises a second terminal,
wherein the display region comprises one group of pixels, another group of pixels, a scan line, and a signal line,
wherein the one group of pixels comprises a pixel,
wherein the one group of pixels is arranged in a row direction,
wherein the another group of pixels comprises the pixel,
wherein the another group of pixels is arranged in a column direction intersecting the row direction,
wherein the scan line is electrically connected to the one group of pixels,
wherein the signal line is electrically connected to the another group of pixels, and
wherein the signal line is electrically connected to the first terminal and the second terminal.

2. The display panel according to claim 1,
wherein the signal line comprises a first region to a third region,
wherein the third region comprises a region sandwiched between the first region and the second region,
wherein the signal line is electrically connected to the first terminal in the first region,
wherein the signal line is electrically connected to the second terminal in the second region, and
wherein the signal line is electrically connected to the pixel in the third region.

3. The display panel according to claim 1, further comprising:
a first driver circuit; and
a second driver circuit,
wherein the first driver circuit is electrically connected to the scan line,
wherein the first driver circuit has a function of supplying a selection signal,
wherein the second driver circuit is electrically connected to the second terminal, and
wherein the second driver circuit has a function of supplying an image signal.

4. A display device comprising:
one group of display panels; and
another group of display panels,
wherein the one group of display panels is arranged in the row direction,
wherein the one group of display panels comprises the display panel according to claim 1,
wherein the another group of display panels is arranged in a column direction intersecting the row direction,
wherein the another group of display panels comprises the display panel and another display panel,
wherein the another display panel comprises a third terminal region and another display region,
wherein the third terminal region is provided outside the another display region,
wherein the third terminal region comprises a region overlapping with the first terminal region,
wherein the third terminal region comprises a third group of terminals,
wherein the third group of terminals comprises a third terminal,
wherein the third terminal is electrically connected to the first terminal, and
wherein the another display region is provided to enable display to be seen from a direction in which display of the display region can be seen.

5. The display device according to claim 4,
wherein the another display panel comprises a fourth terminal region,
wherein the fourth terminal region is provided on a rear side of the another display region,
wherein the fourth terminal region comprises a region overlapping with the another display region,
wherein the fourth terminal region comprises a fourth group of terminals,
wherein the fourth group of terminals comprises a fourth terminal,
wherein the another display region comprises another pixel and another signal line, and
wherein the another signal line is electrically connected to the another pixel, the third terminal, and the fourth terminal.

6. The display device according to claim 4, further comprising:
a control portion,
wherein the control portion is supplied with image data and control data,
wherein the control portion generates data on the basis of the image data,
wherein the control portion generates a first control signal on the basis of the control data,
wherein the control portion supplies the data and the first control signal,
wherein a first driver circuit generates the selection signal and a second control signal on the basis of the first control signal,
wherein the first driver circuit supplies the selection signal and the second control signal,
wherein a second driver circuit supplies an image signal on the basis of the data,
wherein the first terminal region comprises a fifth terminal,
wherein the fifth terminal is electrically connected to the first driver circuit,
wherein the fifth terminal is supplied with the second control signal,
wherein the second terminal region comprises a sixth terminal,
wherein the sixth terminal is electrically connected to the fifth terminal,
wherein the another display panel comprises a third driver circuit and another scan line,
wherein the third driver circuit is electrically connected to the sixth terminal and the another scan line,
wherein the third driver circuit generates and supplies another selection signal on the basis of the second control signal,
wherein the another pixel is electrically connected to the another scan line and the another signal line, and
wherein the another pixel is supplied with the data and the another selection signal.

7. An input/output device comprising:
an input portion; and
a display portion,
wherein the display portion comprises the display panel according to claim 1,
wherein the input portion comprises a sensing region,
wherein the input portion senses an object approaching the sensing region, and
wherein the sensing region comprises a region overlapping with the pixel.

8. A data processing device comprising:
an arithmetic device; and
an input/output device,
wherein the arithmetic device is supplied with input data or sensing data,
wherein the arithmetic device supplies control data and image data,
wherein the input/output device supplies the input data and the sensing data,
wherein the input/output device is supplied with the control data and the image data,
wherein the input/output device comprises a display portion, an input portion, and a sensing portion,
wherein the display portion comprises the display panel according to claim 1,
wherein the display portion displays the image data on the basis of the control data,
wherein the input portion generates the input data, and
wherein the sensing portion generates the sensing data.

9. The data processing device according to claim 8,
wherein the arithmetic device comprises an artificial intelligence portion,
wherein the artificial intelligence portion is supplied with the input data or the sensing data,
wherein the artificial intelligence portion supplies the control data,
wherein the artificial intelligence portion comprises a semiconductor device, and wherein the semiconductor device infers the control data on the basis of the input data or the sensing data.

10. The data processing device according to claim 9,
wherein the semiconductor device comprises a neural network,
wherein the neural network comprises an input layer, an intermediate layer, and an output layer,
wherein the input layer comprises a first group of neuron circuits,
wherein the intermediate layer comprises a second group of neuron circuits,
wherein the output layer comprises a third group of neuron circuits,
wherein the second group of neuron circuits comprises a first neuron circuit and a second neuron circuit,
wherein the first neuron circuit is electrically connected to the first group of neuron circuits,
wherein the second neuron circuit is electrically connected to the third group of neuron circuits,
wherein the first group of neuron circuits is supplied with the input data or the sensing data, and
wherein the third group of neuron circuits supplies the control data.

11. The data processing device according to claim 10,
wherein the first neuron circuit is supplied with one group of input signals, one group of weight data, and a bias signal,
wherein the first neuron circuit comprises a product-sum operation unit and a converter,
wherein the product-sum operation unit is electrically connected to the converter,
wherein the product-sum operation unit generates a product-sum signal on the basis of a product-sum value of the one group of input signals and the one group of weight data and the bias signal, and
wherein the converter generates an output signal on the basis of the product-sum signal.

12. A data processing device comprising:
one or more of a keyboard, a hardware button, a pointing device, a touch sensor, an illuminance sensor, an imaging device, an audio input device, a sight input device, and an attitude detection device; and
the display panel according to claim 1.

\* \* \* \* \*